United States Patent
Hidaka

(10) Patent No.: US 12,345,626 B2
(45) Date of Patent: Jul. 1, 2025

(54) ELLIPSOMETER AND APPARATUS FOR INSPECTING SEMICONDUCTOR DEVICE INCLUDING THE ELLIPSOMETER

(71) Applicant: Samsung Electronics Co., Ltd., Suwon-si (KR)

(72) Inventor: Yasuhiro Hidaka, Yokohama (JP)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 187 days.

(21) Appl. No.: 17/967,228

(22) Filed: Oct. 17, 2022

(65) Prior Publication Data
US 2023/0152213 A1 May 18, 2023

(30) Foreign Application Priority Data

Nov. 18, 2021 (JP) .................................. 2021-187562
Jan. 21, 2022 (KR) ......................... 10-2022-0009233

(51) Int. Cl.
*G01N 21/21* (2006.01)
*G01N 21/45* (2006.01)
(Continued)

(52) U.S. Cl.
CPC ............ *G01N 21/211* (2013.01); *G01N 21/45* (2013.01); *G01N 21/9501* (2013.01);
(Continued)

(58) Field of Classification Search
CPC ......... G01N 21/211; G01N 2201/0633; G01N 21/9501; G01N 2021/215;
(Continued)

(56) References Cited

U.S. PATENT DOCUMENTS 4,602,844 A * 7/1986 Sirat .................... G03H 1/0493
359/30
4,964,707 A * 10/1990 Hayashi ................. G02B 21/14
359/371

(Continued)

FOREIGN PATENT DOCUMENTS

CN        105403514 A * 3/2016 ............. G01N 21/01
EP         1840502 A1    10/2007
(Continued)

OTHER PUBLICATIONS

Hsieh, Hung-Lin, and Wei Chen. "Heterodyne Wollaston laser encoder for measurement of in-plane displacement." Optics express 24.8 (2016): 8693-8707. (Year: 2016).*

(Continued)

*Primary Examiner* — Mohamed K Amara
*Assistant Examiner* — Noah J. Haney
(74) *Attorney, Agent, or Firm* — Harness, Dickey & Pierce, P.L.C.

(57) ABSTRACT

An ellipsometer capable of improving a throughput calculating ellipsometry coefficients ($\Psi$, $\Delta$) even when performing measurement with a combination of a light source having a wide wavelength band and a spectrometer, and an apparatus for inspecting a semiconductor device is e hid g the ellipsometer may be provided. The ellipsometer includes a polarizing optical element unit for separating reflected light into two polarization components having polarization directions that are orthogonal to each other in a radial direction with respect to an optical axis of an optical system of the reflected light, an analyzer unit for transmitting components of a direction different from the polarization directions of the two polarization components to make the two polarization components interfere with each other, and to form an interference fringe in a form of a concentric circle, an image detector for detecting the interference (Continued)

fringe, and processing circuitry for calculating ellipsometry coefficients from the interference fringe.

20 Claims, 27 Drawing Sheets

(51) Int. Cl.
| | | |
|---|---|---|
| *G01N 21/88* | (2006.01) | |
| *G01N 21/95* | (2006.01) | |
| *G02B 5/30* | (2006.01) | |
| *H01L 21/67* | (2006.01) | |
| *G03F 7/00* | (2006.01) | |

(52) U.S. Cl.
CPC ......... *G02B 5/3066* (2013.01); *G02B 5/3083* (2013.01); *H01L 21/67253* (2013.01); *G01N 2021/215* (2013.01); *G01N 2021/216* (2013.01); *G01N 2021/8848* (2013.01); *G01N 2201/0633* (2013.01); *G03F 7/706851* (2023.05)

(58) Field of Classification Search
CPC ..... G01N 2021/216; G01N 2021/8848; G01N 21/45; G01N 21/21; G01N 2021/213; G01N 2201/0683; G02B 5/3066; G02B 5/3083; G02B 3/06; G02B 5/04; G02B 5/3025; G02B 27/141; G02B 27/283; G02B 27/286; G02B 27/30; G02B 27/106; G02B 27/144; H01L 21/67253; G03F 7/706851; G01B 11/06; G01B 2210/56; G01B 11/0641; G01B 11/0675; G01B 11/2441; G01B 9/02011; G01B 11/00; G01B 9/02084; G01B 9/02098; G01B 11/0625; G01J 3/0208; G01J 3/021; G01J 3/45; G01J 2003/1208; G01J 9/02
USPC .......................................... 356/365
See application file for complete search history.

(56) References Cited

U.S. PATENT DOCUMENTS

| | | | |
|---|---|---|---|
| 5,596,411 A | 1/1997 | Fanton et al. | |
| 5,604,591 A * | 2/1997 | Kitagawa ................. | G01J 9/02 356/491 |
| 5,953,137 A | 9/1999 | Sirat et al. | |
| 6,856,384 B1 | 2/2005 | Rovira | |
| 7,471,396 B2 | 12/2008 | Jansen | |
| 7,616,323 B2 | 11/2009 | De Lega et al. | |
| 7,667,841 B2 | 2/2010 | Opsal | |
| 9,574,992 B1 | 2/2017 | Salcin et al. | |
| 2005/0248773 A1* | 11/2005 | Rosencwaig ...... | G01B 11/0625 356/504 |
| 2013/0265576 A1* | 10/2013 | Acher ........................ | G01J 4/00 356/369 |
| 2014/0192364 A1* | 7/2014 | Yatagai .................... | G01J 4/00 356/491 |
| 2020/0209155 A1* | 7/2020 | Kim ........................ | G01N 21/45 |
| 2021/0156790 A1 | 5/2021 | Hidaka | |
| 2022/0003535 A1 | 1/2022 | Hidaka | |
| 2022/0252392 A1* | 8/2022 | Goodwin ............... | G01B 15/04 |

FOREIGN PATENT DOCUMENTS

| | | | | |
|---|---|---|---|---|
| JP | S62-197706 A | | 9/1987 | |
| JP | H 04-328431 A | | 11/1992 | |
| JP | 2000-331927 A | | 11/2000 | |
| JP | 2003-279854 A | | 10/2003 | |
| JP | 2005-538359 A | | 12/2005 | |
| JP | 2007-263748 A | | 10/2007 | |
| JP | 2010-002846 A | | 1/2010 | |
| JP | 2013-145229 A | | 7/2013 | |
| JP | 2018124202 A | * | 8/2018 | ............... G01J 3/18 |
| JP | 2021-056247 A | | 4/2021 | |
| JP | 2021-060283 A | | 4/2021 | |
| JP | 2021-085698 A | | 6/2021 | |
| JP | 2022-013258 A | | 1/2022 | |
| WO | WO-2004023071 A1 | * | 3/2004 | ......... G01B 11/0675 |
| WO | WO-2013-088871 A1 | | 6/2013 | |
| WO | WO-2017-127789 A1 | | 7/2017 | |
| WO | WO-2021-070708 A1 | | 4/2021 | |

OTHER PUBLICATIONS

Yukitoshi Otani, "Spectroscopic Mueller Matrix Polarimetry," ???? vol. 35, No. 9, pp. 510-515, (2014).
Harland G. Tompkins, et al. "Handbook of Ellipsometry" William Andrew Publishing pp. 1-902 (2005).
Garcia-Caurel, et al. "Application of Spectroscopic Ellipsometry and Mueller Ellipsometry to Optical Characterization," Applied Spectroscopy, pp. 1-22 (2013).
Mitsuo Takeda, et al. "Topometry and Interferometry by Use of a FFT Algorithm for Fringe Pattern Analysis," University of Electro-communications, pp. 1-5 (1981).
Topometry and Interferometry by Use of a FFT Algorithm for Fringe Pattern Analysis (1981).
Hiroyuki Fujiwara, Spectroscopic Ellipsometry Principles and Applications.
Jung, J. et al. A breakthrough on throughput and accuracy limitation in ellipsometry using self-interference holographic analysis. Proc. SPIE, 116111J (2021).
Japanese Notice of Allowance dated Jan. 28, 2025 issued in Japanese Patent Application No. 2021-187562.

* cited by examiner

FIG. 8
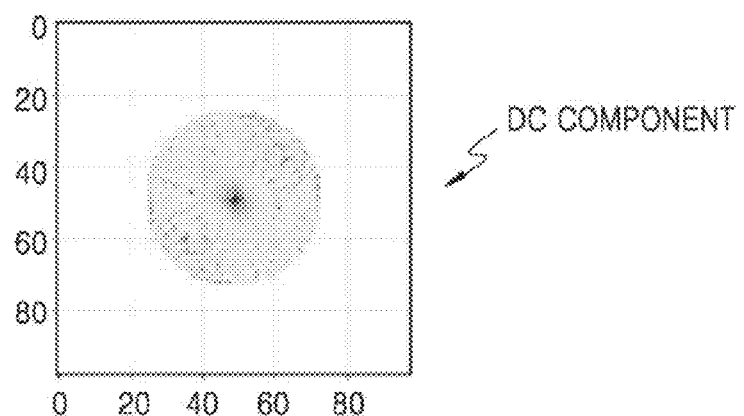
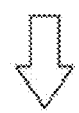
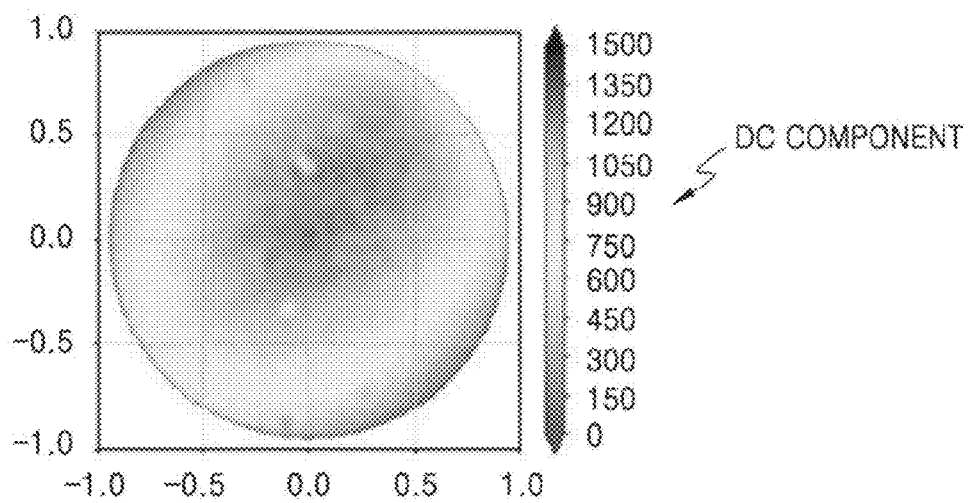

FIG. 9
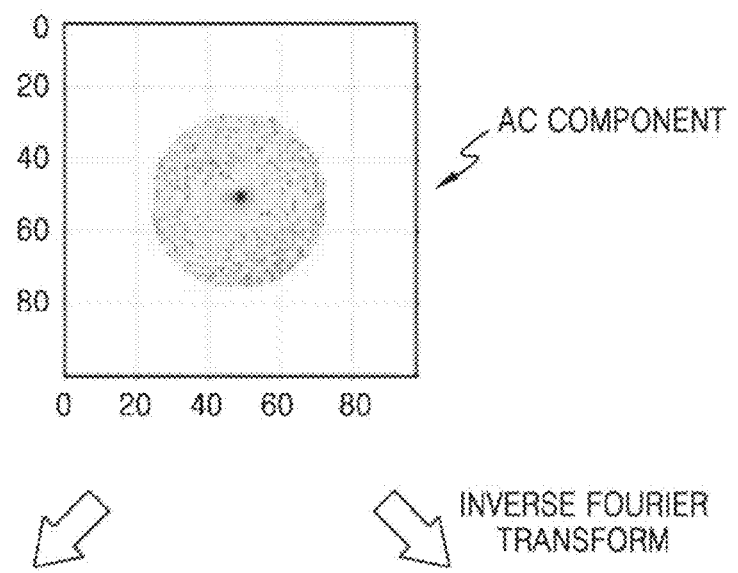
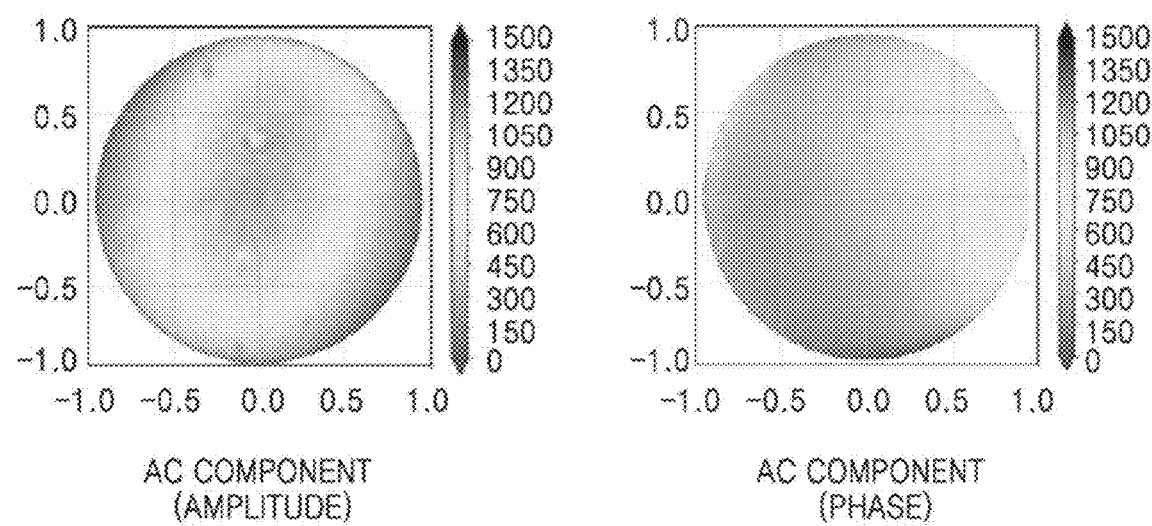

ELLIPSOMETER AND APPARATUS FOR INSPECTING SEMICONDUCTOR DEVICE INCLUDING THE ELLIPSOMETER

CROSS-REFERENCE TO RELATED APPLICATIONS

This application is based on and claims priority under 35 U.S.C. § 119 to Japanese Patent Application No. 2021-187562, filed on Nov. 18, 2021, in the Japanese Patent Office and Korean Patent Application No. 10-2022-0009233, filed on Jan. 21, 2022 in the Korean Intellectual Property Office, the disclosures of which are incorporated by reference herein in their entireties.

BACKGROUND

The inventive concepts relate to apparatuses for inspecting a semiconductor device, and more particularly, to apparatuses for inspecting a semiconductor device by using an ellipsometer.

In ellipsometry, because automatic measurement was made possible by Aspnes et al. in 1975, measurement time has been significantly shortened and precision has been greatly improved, and spectral ellipsometry that makes measurement by multiple wavelengths is also being put to practical use. In non-destructive measurement of thin films and microstructures, ellipsometry is widely used in semiconductor manufacturing processes by taking advantage of the characteristic of measuring dimensions, such as film thickness, and optical constants, such as refractive index with high precision.

SUMMARY

The inventive concepts provide ellipsometers capable of improving a throughput calculating ellipsometry coefficients ($\Psi$, $\Delta$) even when performing measurement with a combination of a light source having a wide wavelength band and a spectrometer, and/or apparatuses for inspecting a semiconductor device including the ellipsometer.

In addition, the problems to be solved by the inventive concepts are not limited to the problems mentioned above, and other problems m be clearly understood by those skilled in the art from the following description.

According to an example embodiment, an ellipsometer may include a polarizing optical element unit configured to separate reflected light into two polarization components, the two polarization components having polarization directions that are orthogonal to each other in radial direction with respect to an optical axis of a condensing optical system of the reflected light, the reflected light being light reflected front a measurement surface of a sample when illumination light illuminate the measurement surface of the sample, the illumination light comprising at least one of linear polarization, circular polarization, or elliptical polarization, with respect to the two polarization components, an analyzer unit configured to transmit components in a direction, which is different from each of the polarization directions of the two polarization components, to make the two polarization components interfere with each other, and to form an interference fringe in a them of a concentric circle, an image detector configured to detect the interference fringe, and processing circuitry configured to calculate ellipsometry coefficients $\Psi$ and $\Delta$ from the detected interference fringe.

According to an example embodiment, an ellipsometer may include a polarizing optical element unit configured to separate reflected light reflected light into two linear polarization components, the two linear polarization components having polarization directions that are orthogonal to each other, the reflected light being light reflected from a measurement surface of a sample when illumination light comprising, linear polarization illuminates the measurement surface of the sample, with respect to the two linear polarization components, an analyzer unit configured to transmit components in a direction, which is different from each of the polarization directions of the two linear polarization components, to make the two linear polarization components interfere with each other, and form an interference fringe in a form of a stripe, an image detector configured to detect the interference fringe, and processing circuitry configured to calculate ellipsometry coefficients $\Psi$ and $\Delta$ from the detected interference fringe. A stripe pitch of the interference fringe may have a same value at a plurality of wavelengths of the illumination light.

According to an example embodiment, an apparatus for inspecting a semiconductor device may include an ellipsometer, a stage configured to receive thereon the semiconductor device as an inspection target is disposed and an environment chamber configured to isolate a part of the ellipsometer and the stage from an external environment. The ellipsometer may include a polarizing optical element unit configured to separate two polarization components of reflected light in a polarization direction, the two polarization components being orthogonal to each other in a radial direction with respect to an optical axis of an optical system of the reflected light, the reflected light being light reflected from a measurement surface of a sample when illumination light illuminate the measurement surface of the sample, the illumination light comprising at least one of linear polarization, circular polarization, or elliptical polarization, with respect to the two polarization components, an analyzer unit configured to transmit components of a direction, which is different from the polarization direction of each of two polarization components, to make the two polarization components interfere with the components each other and to form an interference fringe in a concentric circle, all image, detector configured to detect the interference fringe, and processing circuitry configured to calculate ellipsometry coefficients $\Psi$ and $\Delta$ from the detected interference fringe.

According to an example embodiment, an ellipsometer may include an illumination optical system configured to illuminate a sample with illumination light comprising at least one of linear polarization, circular polarization, or elliptical polarization, a condensing optical system configured to condense reflected light, the reflected light being light reflected from a measurement surface of the sample when the illumination light illuminates the measurement surface of the sample, a polarizing optical element unit configured to separate the reflected light into two polarization components, the two polarization components having polarization directions that are orthogonal to each other or separate the two polarization components in a radial direction with respect to an optical axis of the condensing optical system, and a light receiving optical system comprising an analyzer unit, the light receiving optical system configured to calculate ellipsometry coefficients $\Psi$ and $\Delta$ from an interference fringe formed through the analyzer unit. With respect to the two polarization components, the analyzer unit may be configured to transmit components of a direction, which is different from each of the polarization directions of the two polarization components to make the two polarization components interfere with each other, and to form an interference fringe in a form of a stripe Or a concentric circle.

BRIEF DESCRIPTION OF THE DRAWINGS

Some example embodiments of the inventive concepts will be more clearly understood from the following detailed description taken in conjunction with the accompanying drawings in which:

FIGS. 7 to 9 are conceptual diagrams of a method of analyzing an interference fringe of reflected light interfering on the image detector in the ellipsometer of FIG. 4;

DETAILED DESCRIPTION

Figure 1:
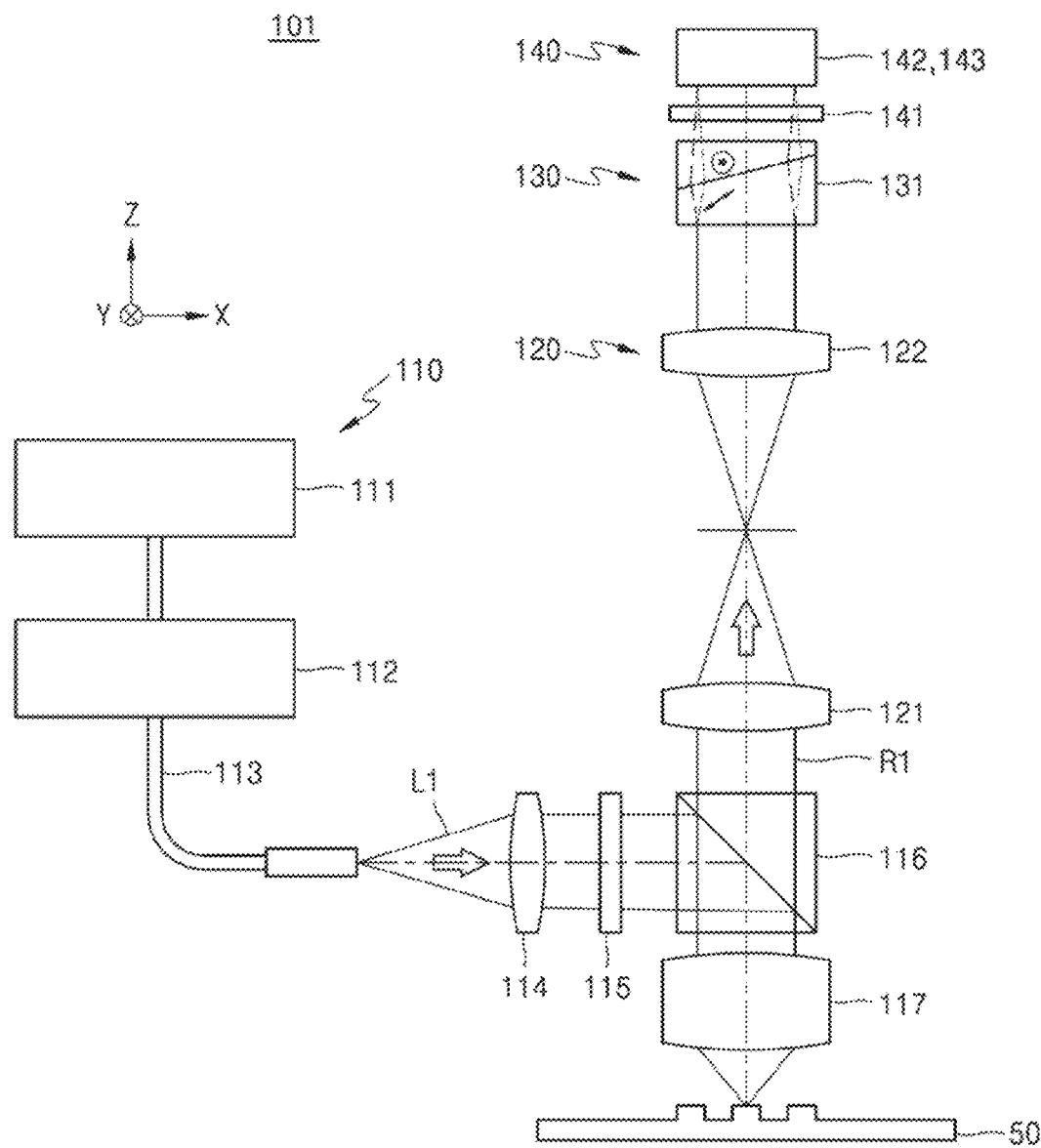
FIG. 1 is a configuration diagram schematically showing an ellipsometer according to a comparative example.

Hereinafter, some example embodiments of the inventive concepts will be described in detail with reference to the accompanying drawings. The same reference numerals are used for the same components in the drawings, and redundant descriptions thereof are omitted.

Currently, as an optical critical dimension (OCD) measuring apparatus that measures a dimension of a microstructure with a line width equal to or less than 10 nm of a circuit pattern on a wafer, a length measuring scanning electron-beam microscope (SEM) or atomic force microscope (AFM) is used in a complementary form. In addition, in the last 10 years, semiconductor circuit structures, such as fin field-effect transistors (finFETs) in logic semiconductors and a 3D-NAND in memory semiconductors, have progressed to three-dimensionalization and become more complex. Most OCDs use spectral ellipsometry as a measurement principle and in order to obtain the dimension of a semiconductor circuit structure that is a measurement target or the optical constant of a constituent material of semiconductor circuit that is a measurement target, a method is taken to obtain a solution by creating a model and fitting the model to a measurement result using the dimension or optical constant of the measurement target as a floating parameter. For this reason, when the structure of the target to be sought becomes complicated, the number of floating parameters may increase. For example, in the current measurement with respect to the OCD of finFET, it is desired to use about 20 to about 30 floating parameters. Ellipsometry generally obtains two values of $\Psi$ and $\Delta$ as ellipsometry coefficients, which are measurement results, but both the ellipsometry coefficients $\Psi$ and $\Delta$ are wavelength dependent. For this reason, in the case of spectral ellipsometry, the ellipsometry coefficients $\Psi$ and $\Delta$ may be expressed as $\Psi(\lambda)$ and $\Delta(\lambda)$, respectively.

In order to obtain a solution of the dimension, it is at least desired for the fitting of the model to obtain a larger number of ellipsometry coefficients $\Psi$, $\Delta$ than the number of floating parameters, through measurement. As a problem that occurs when the number of floating parameters is large, there are cases where the fitting converges with a combination of floating parameters different from the actual dimension. This is a problem called coupling, and in order to avoid this, it is effective or desirable to perform fitting by measuring the ellipsometry coefficients $\Psi$, $\Delta$ having different dependencies on the floating parameters. Therefore, in addition to wavelength, it is desirable to perform ellipsometry measurements at different angles of incidence and azimuth of incidence, and use the ellipsometry coefficients $\Psi$, $\Delta$ having different dependencies on each other for fitting the model with respect to the above floating parameters.

In addition, from the viewpoint of measurement sensitivity, in illumination light to a semiconductor wafer, the Brewster angle at which the reflectance of P polarization is 0 has the highest measurement sensitivity. For this reason, in the ellipsometry measurement, the Brewster angle is often performed as an angle of incidence. This angle of incidence may correspond to approximately 60° to 75° in the semiconductor circuit structure. When performing measurement with such an oblique incidence, spectral ellipsometry measurement is often performed using an oblique incidence optical system specialized for a single angle of incidence and azimuth of incidence. However, in order to avoid the coupling problem described above, there is a growing demand for an optical system capable of responding to a plurality of angles of incidence or azimuth of incidence.

In response to such a request, when the optical system or semiconductor wafer is moved for each measurement, there is a problem in that a measurement time greatly increases. For this reason, by using an objective lens having a large numerical aperture (NA) including the Brewster angle described above, measurement light is simultaneously incident from a wide range of angle of incidence and azimuth of incidence. Then, ellipsometry measurement is performed by deriving reflected light from the semiconductor wafer onto an exit pupil of an objective lens. Such a combination of a pupil image measurement optical system and the ellipsometry measurement may be ideal. However, even in this case, in a configuration in which a rotation compensator is combined with a rotation analyzer, as is the case for general methods of ellipsometry measurement, the measurement time for each wavelength may be equal, to or greater than 1 second due to the limitation of an obtained pupil image transmission speed. In addition, when spectral ellipsometry measurement using illumination fight of 100 wavelengths or more is performed, the measurement time may be unrealistic for the OCD measurement apparatus in a semiconductor manufacturing process.

An ellipsometer used in the OCD measurement apparatus in the semiconductor manufacturing process typically needs a measurement time of 1 second to several seconds to measure one point. Within the time allotted for measurement, only several to tens of points are usually measured in the wafer, and thus yield deterioration due to as partial film thickness change or line width change in the wafer may be missed. Some reasons for this are that (1) a certain number of measurement points are desired in synchronization with modulation by the rotation compensator or phase modulation element, (2) in the case of spectroscopic measurement, it is desired to measure an amount of light divided by each wavelength in a dispersion element, such as a diffraction grating at a high S/N ratio, and further (3) in the case if Mueller matrix ellipsometry, the measurement needs to be performed while switching several types of polarization states in the illumination light.

In this regard, in order to shorten the measurement time of ellipsometry while increasing measurement points in the wafer, it is desired to speed up a movable portion such as the rotation compensator. However, stability and heat generation become obstacles, and it is difficult to improve the throughput of ellipsometry coefficient measurement for OCD measurement, etc.

FIG. 1 is a configuration diagram schematically showing an ellipsometer 101 according to a comparative example.

Referring to FIG. 1, the ellipsometer 101 of the comparative example may make two orthogonal polarization components interfere on an image detector 142 by using a Nomarski prism 131. Then, an analysis apparatus 143 may obtain Ψ and Δ from the amplitude and phase of a generated interference fringe. By using such a method, the practical application of the OCD apparatus with a high stability due to the absence of the movable portion is expected while realizing a high throughput, in the semiconductor manufacturing process.

Meanwhile, an illumination optical system 110 includes a light source 111, a spectrometer 112, a fiber 113, an illumination lens 114, a polarizer 115, a beam splitter 116, and an objective lens 117, and may illuminate a sample 50 with illumination light L1. A condensing optical system 120 includes the objective lens 117, the beam splitter 116, and relay lenses 121 and 122, and may condense reflected light R1 reflected from the sample 50. A polarizing optical element 130 may include the Nomarski prism 131, and a light receiving optical system 140 may include an analyzer unit 141, an image detector 142, and the analysis apparatus 143.

This method may obtain and Δ from a single image without obtaining a Stokes parameter, which is common in ellipsometry measurement. For this reason, the measurement efficiency is relatively good, and spectral ellipsometry is also possible by combining the ellipsometer 101 with a high-speed spectrometer. By applying this measurement principle to pupil image measurement using the objective lens 117 of a large NA, ellipsometry information of multiple angles of incidence and azimuth of incidence may be obtained simultaneously, and ideal performance may be realized or approximated for a measurement apparatus in the semiconductor manufacturing process.

Figure 2:
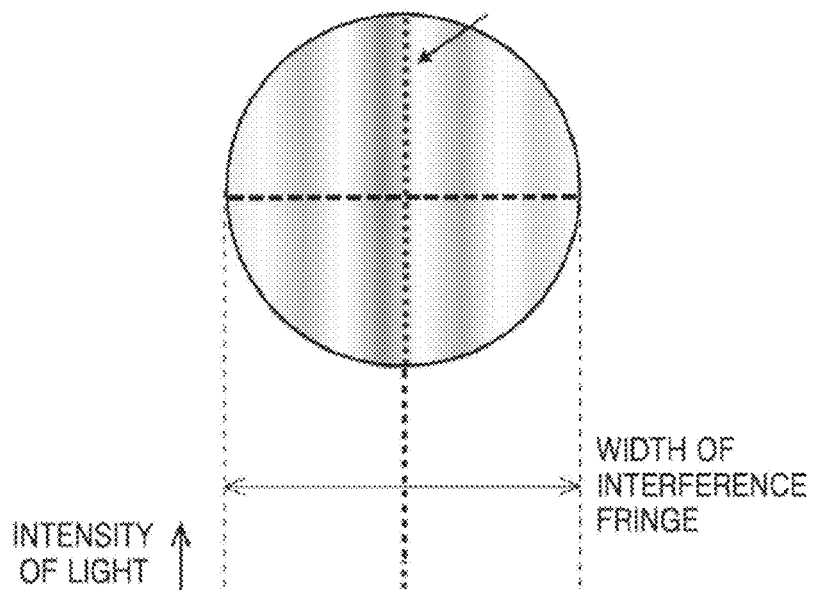
FIG. 2 is a photograph showing an interference fringe on an image detector in the ellipsometer of FIG. 1.

FIG. 2 is a photograph showing an interference fringe on the image detector 142 in the ellipsometer 101 of FIG. 1. In the graph, the x-axis represents a location of the interference fringe on the image detector 142, and the y-axis represents the intensity of light of the interference fringe.

Referring to FIG. 2, the ellipsometer 101 of FIG. 1 may form the interference fringe of vertical stripes on the image detector 142 by, for example, interfering X polarization and Y polarization. On the vertical line transmitting through the center of the image detector 142, an optical path length difference between the X polarization and the Y polarization is 0. When a width of a wavelength is wide, the contrast of the interference fringes on both sides deteriorates.

As described above, because partial coherent light is used as the illumination light L1, when the number of interference fringes formed on the pupil increases, as shown in FIG. 2, in regions on the left and right sides where the optical path length difference of two polarization components is large, the contrast of the interference fringe deteriorates. The phenomenon that the contrast of the interference fringes deteriorates in the region where the optical path length difference is large means that there is an upper limit on the number of available interference fringes.

Figure 3:
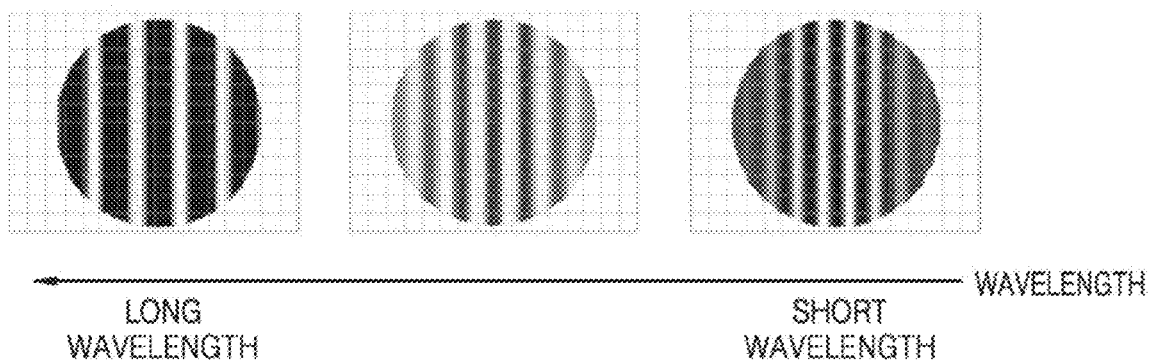
FIG. 3 illustrates photographs showing interference fringes when widths of wavelengths are the same in illumination light of a long wavelength, a medium wavelength, and a short wavelength in the ellipsometer of FIG. 1.

FIG. 3 illustrates photographs showing interference fringes when widths of the wavelengths are the same in illumination light of a long: wavelength, a medium wavelength, and a short wavelength in the ellipsometer 101 of FIG. 1.

Referring to FIG. 3, when widths of the wavelengths are the same, because the number of interference fringes of the short wavelength increases, the shorter the wavelength, the lower the contrast of the interference fringes. In order to avoid this problem, it is desired to reduce a polarization separation angle by the Nomarski prism 131 or to narrow the wavelength width upon Measurement at the short wavelength. However, in the former case, especially on the long wavelength side, because a stripe space widens, a measurement resolution on the pupil may deteriorate. In the latter case, a side effect of decreasing an amount of light at the short wavelength may occur.

Therefore, even upon measurement with a combination of a light source having a wide wavelength band and a spectrometer, an ellipsometer capable of suppressing a decrease in resolution due to the widening of the stripe space and a decrease in the amount of light due to narrowing the width of wavelength of a spectrometer, and improving a throughput calculating the ellipsometry coefficients Ψ and Δ is desired.

Figure 4:
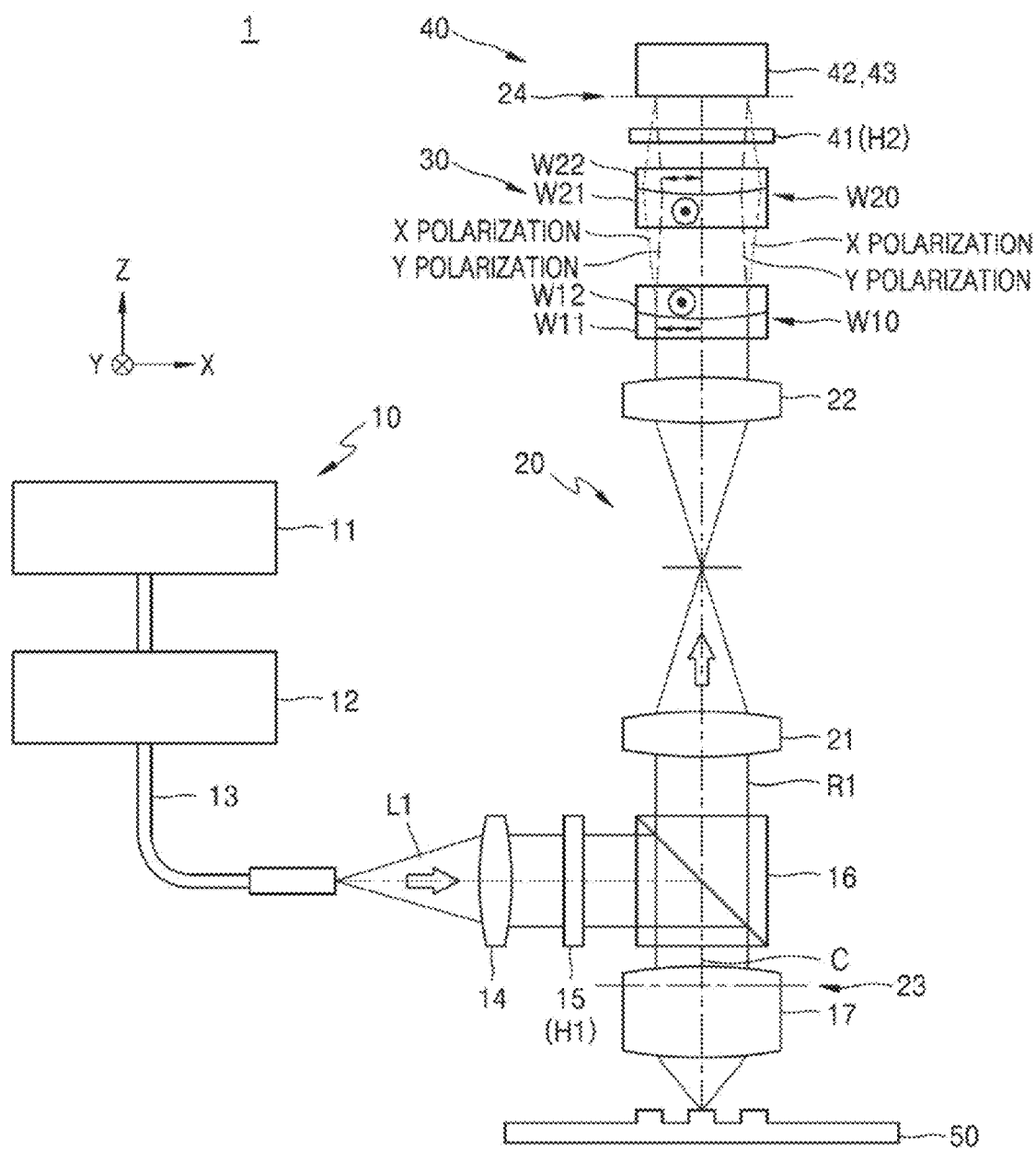
FIG. 4 is a configuration diagram schematically showing an ellipsometer according to an example embodiment of the inventive concepts.

FIG. 4 is a configuration diagram schematically showing art ellipsometer 1 according to an example embodiment of the inventive concepts.

Referring to FIG. 4, the ellipsometer 1 of the present example embodiment may include an illumination optical system 10, a condensing optical system 20, a polarizing optical element unit 30, and a light receiving optical system 40. The ellipsometer 1 may receive the reflected light R1 reflected from the sample 50 when the illumination light L1 illuminates the sample 150, to obtain the ellipsometry coefficients Ψ and Δ.

The illumination optical system 10 may illuminate the sample 50 with the illumination light L1 including a linear polarization. The illumination optical system 10 may include a light source 11, a spectrometer 12, a fiber 13, an illumination lens 14, a polarizer unit 15, a beam splitter 16, and an objective lens 17.

The light source 11 may generate the illumination light L1. The illumination light L1 generated by the light source 11 may include light having a broadband wavelength. The illumination light L1 may be, for example, white light. However, the illumination light L1 generated by the light source 11 is not limited to white light. For example, the illumination light L1 may include monochromatic light having a specific wavelength or light having a specific wavelength width. The illumination light L1 generated by the light source 11 may be incident on the spectrometer 12.

The spectrometer 12 may extract and emit light having a specific wavelength width from the incident illumination light L1. The spectrometer 12 may emit light with a center wavelength of 400 nm having a wavelength width of, for example, 10 nm. The illumination light L1 emitted from the spectrometer 12 may be incident on the fiber 13.

The fiber 13 may be a light guide member having one end and the other end in a cable shape. The illumination light L1 incident on one end of the fiber 13 may be emitted from the other end of the fiber 13. The illumination light L1 emitted from the other end of the fiber 13 may be incident on the illumination lens 14.

The illumination lens 14 may be, for example, a convex lens. The illumination lens 14 may change an angular distribution of the incident illumination light L1 and irradiate the illumination light L1 to the polarizer unit 15. For example, the illumination lens 14 may convert the illumination light L1 emitted from the other end of the fiber 13 into parallel light. In addition, the illumination lens 14 may make the illumination light L1 convened into the parallel light be incident on the polarizer unit 15.

The illumination light L1 generated by the light source 11 may be incident on the polarizer unit 15. The polarizer unit 15 may include, for example, a linear polarizer H1 that generates the linear polarization. Accordingly, the polarizer unit 15 may transmit the illumination light L1 including the linear polarization in one direction. For example, the polarizer unit 15 may emit the illumination light L1 of the linear polarization of which polarization direction is inclined by 45° with respect to a surface to the beam splitter 16.

The beam splitter 16 may reflect a part of the incident illumination light L1 and transmit a part thereof. The beam splitter 16 may reflect a part of the incident illumination light L1 toward the objective lens 17. The illumination light L1 reflected by the beam splitter 16 may be incident on the objective lens 17.

The objective lens 17 may illuminate the sample 50 with the illumination light L1 including the linear polarization. The objective lens 17 may illuminate the sample 50 by condensing the illumination light L1 reflected by the beam splitter 16 in a dotted shape. The objective lens 17 has an NA. The objective lens 17 may illuminate the specimen 50 from all angles and all directions within the NA. The NA of the objective lens 17 may be a value, for example, equal to or greater than 0.95, including the Brewster's angle with respect to the sample 50.

The objective lens 17 may transmit the illumination light L1 and the reflected light R1 reflected from a measurement surface of the sample 50 by the illumination light L1. In the ellipsometer 1 of the present example embodiment, an optical axis C of the illumination light L1 incident on the sample 50 and an optical axis C of the reflected light R1 reflected from the sample 50 may be orthogonal to the measurement surface of the sample 50.

Here, for convenience of description of the ellipsometer 1 of the present example embodiment, an XYZ rectangular coordinate axis system is introduced. A Z-axis direction is defined as the optical axis C. Two directions orthogonal to the Z-axis direction and orthogonal to each other are defined as an X-axis direction and a Y-axis direction.

The illumination light L1 illuminating the sample 50 may include a linear polarization in one direction. The illumination light L1 including the linear polarization in one direction may be incident on the measurement surface of the sample 50 while being condensed. Therefore, in the case of the illumination light L1, which is full polarization and linear polarization, when the optical axis C is orthogonal to the measurement surface of the sample 50, according to a direction incident on the measurement surface the illumination L1 may include part of P polarization and part of S polarization. The part of the P polarization in the illumination light L1 may be reflected as the P polarization. The part of the S polarization in the illumination light L1 may be reflected as the S polarization.

The condensing optical system 20 may condense the reflected light R1 from reflected from the sample 50. The condensing optical system 20 may include the objective lens 17, the beam splitter 16, and relay lenses 21 and 22. The objective lens 17 is a member of the illumination optical system 10 as well as a member of the condensing optical system 20. The reflected light R1 reflected from the sample 50 may transmit through a pupil location 23 of the objective lens 17. Further, the pupil location 23 may be reimaged on the image detector 42 by the relay lenses 21 and 22. As described above, the condensing optical system 20 may image an exit pupil of the objective lens 17 on the image detector 42. The objective lens 17 may transmit the reflected light R1 reflected from the sample 50 by the illumination light L1 to be incident on the beam splitter 16.

The beam splitter 16 may transmit part of the incident reflected light R1. For example, the reflected light R1 transmitting through the beam splitter 16 may be incident on the lower relay lens 21.

The lower relay lens 21 may condense the reflected light R1 that transmitted through the beam splitter 16 to form an image, and then make the reflected light R1 be incident on the upper relay lens 12. The upper relay leas 22 may transmit the incident reflected light R1 to be incident on the polarizing optical element unit 30.

The polarizing optical element emit 30 may separate the reflected light R1 into two linear polarization components, where the two linear polarization components of the reflected light R1 has polarization directions that are orthogonal to each other in a radial direction with respect to the optical axis C of the condensing, optical system 20 of the reflected light R1. The reflected light R1 is light reflected from the measurement surface of the sample 50 when the light L1 including the linear polarization illuminates the measurement surface of the sample. The polarizing optical element unit 30 may include, for example, a Wollaston lens. Also, as shown in FIG. 4, the polarizing optical element unit 30 may include a plurality of Wollaston lenses W10 and W20. The lower Wollaston lens W10 may include two birefringent crystals W11 and W12. The upper Wollaston lens W20 may also include two birefringent crystals W21 and W22.

The first birefringent crystal W11 may include a uniaxial birefringent crystal. The first birefringent crystal W11 may have an incidence surface having a planar shape and an exit surface having a concave spherical shape. The first birefringent crystal W11 may have a crystal optical axis in the X-axis direction. The second birefringent crystal W12 may include a uniaxial birefringent crystal. The second birefringent crystal W12 may have an incidence surface having a convex spherical shape and an exit surface having a planar shape. The second birefringent crystal W12 may have a crystal optical axis in the Y-axis direction. Accordingly, the lower Wollaston lens W12 may include two uniaxial birefringent crystals having a spherical shape to fit each other. A crystal optical axis of each of the uniaxial birefringent crystals of the lower Wollaston lens W10 may be orthogonal to the optical axis C of the condensing optical system 20 and the crystal optical axes of the uniaxial birefringent crystals of the lower Wollaston lens W10 may be orthogonal to each other.

The third birefringent crystal W21 may include a uniaxial birefringent crystal. The third birefringent crystal W21 may have an incidence surface having a planar shape and an exit surface having a concave spherical shape. The third birefringent crystal W21 may have a crystal optical axis in the Y-axis direction. The fourth birefringent crystal W22 may include a uniaxial birefringent crystal. The fourth birefringent crystal W22 may have an incident surface having a convex spherical shape and an exit surface having a planar shape. The fourth birefringent crystal W22 may have a crystal optical axis in the X-axis direction. Accordingly, the upper Wollaston lens W20 may include two uniaxial birefringent crystals having a spherical shape to fit each other. A crystal optical axis of each of the uniaxial birefringent crystals of the upper Wollaston lens W20 is orthogonal to the optical axis C of the condensing optical system 20 and the crystal optical axes of the uniaxial birefringent crystals of the upper Wollaston lens W20 may be orthogonal to each other.

Each of the birefringent crystals W11, W12, W21, and W22 may include any one of quartz, magnesium fluoride, sapphire, calcite, or Alpha-Barium Borate ($\alpha$BBO) as a material. In the polarizing optical element unit 30, the Wollaston lenses W10 and W20 may have a refractive power of 0. Accordingly, the polarizing optical element unit 30 may not condense or diffuse the reflected light R1.

In the lower Wollaston lens W10, the crystal optical axis of the first birefringent crystal W11 and the crystal optical axis of the second birefringent crystal W12 may be arranged to be perpendicular to each other kind orthogonal to the optical axis C. For example, the crystal optical axis of the first birefringent crystal W11 may be in the X-axis direction, and the crystal optical axis of the second birefringent crystal W12 may be in the Y-axis direction. Accordingly, two perpendicular polarizations (X polarization and Y polarization in FIG. 4) may be radially separated with respect to the optical axis C and proceed in different directions. For example, the X polarization may be separated outwardly away from the optical axis C than the Y polarization. The Y polarization may be separated inwardly closer to the optical axis C than the X polarization.

The polarizing optical element unit 30 may further include another set of upper Wollaston lenses W20. In the upper Wollaston lens W20, the crystal optical axis of the third birefringent crystal W21 and the crystal optical axis of the fourth birefringent crystal W22 may be arranged to be perpendicular to each other and orthogonal to the optical axis C. However, in the upper Wollaston lens W20, the crystal optical axis of each of the birefringent crystals may be opposite to the crystal optical axis of each of the birefringent crystals of the lower Wollaston lens W10. For example, the crystal optical axis of the third birefringent crystal W21 may be in the Y-axis direction, and the crystal optical axis of the fourth birthing-era crystal W22 may be in the X-axis direction. Accordingly, the arrangement and radius of curvature of two sets of Wollaston lenses W10 and W20 may be designed such that the respective polarizations are separated in opposite directions, and the two polarizations become the same point again on the image detector 42. Accordingly, two polarization components of the reflected light R1 transmitted through the polarizing optical element unit 30 and the analyzer unit 41 may be detected at the same point on the image detector 42.

The light receiving optical system 40 may receive the reflected light R1 to calculate the ellipsometry coefficients $\Psi$ and $\Delta$. The light receiving optical system 40 may include an analyzer unit 41, an image detector 42, and an analysis apparatus 43. The analyzer unit 41 may include, for example, a linear polarizer H2 that transmits a linear polarization component in a certain direction.

Figure 5:
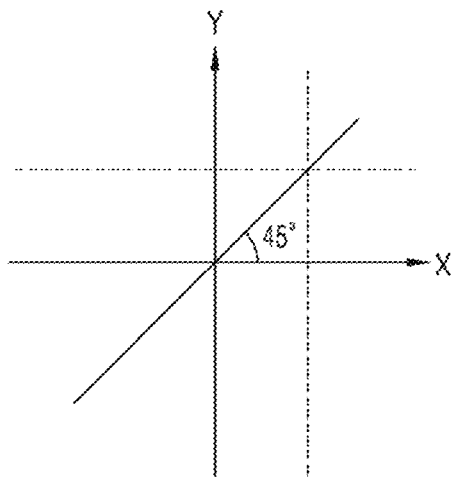
FIG. 5 is a graph showing linear polarization transmitting through an analyzer unit in the ellipsometer of FIG. 4.

FIG. 5 is a graph showing linear polarization transmitting through the analyzer unit 41 in the ellipsometer 1 of FIG. 4. FIG. 5 will be described with reference to FIG. 4.

Referring to FIG. 5, the analyzer unit 41 may transmit components of linear polarization of a 45° inclined direction with respect to a polarization direction in the X direction and a polarization direction in the Y direction separated by the polarizing optical element unit 30. Accordingly, the analyzer unit 41 may transmit the polarization component of the 45° inclined direction with respect to the X direction among the linear polarizations having the polarization direction in the X direction. In addition, the analyzer unit 41 may transmit the polarization component of the 45° inclined direction with respect to the Y direction among the linear polarizations having the polarization direction in the Y direction. As described above, the analyzer unit 41 such as the linear polarizer H2 may be disposed between the upper Wollaston lens W20 and the image detector 42. A transmission axis direction of the linear polarizer H2 may be arranged in an azimuth that is intermediate (45°) of the optical axis of each of the two uniaxial birefringent crystals forming the Wollaston lenses W10 and W20. Accordingly, the analyzer unit 41 may make two orthogonal polarization components interfere with each other by transmitting a component in a direction different from each polarization direction, and form an interference fringe in the form of a concentric circle. That is, the two polarization components may interfere with each other while being emitted as polarization components polarized in the same direction (the 45° inclined direction) by transmitting through the analyzer unit 41.

The image detector 42 may receive the incident reflected light R1. The image detector 42 may be disposed at a pupil conjugate location 24 that is conjugate with the pupil location 23 of the objective lens 17. The reflected light R1 may include polarization components in the same direction in two linear polarizations orthogonal to each other. Accordingly, the reflected light R1 may interfere on the image detector 42. Accordingly, the interference fringe in the form of a concentric circle may be formed on the image detector 42. The image detector 42 may detect an interference fringe of each polarization component that transmitted through the analyzer unit 41.

Figure 6:
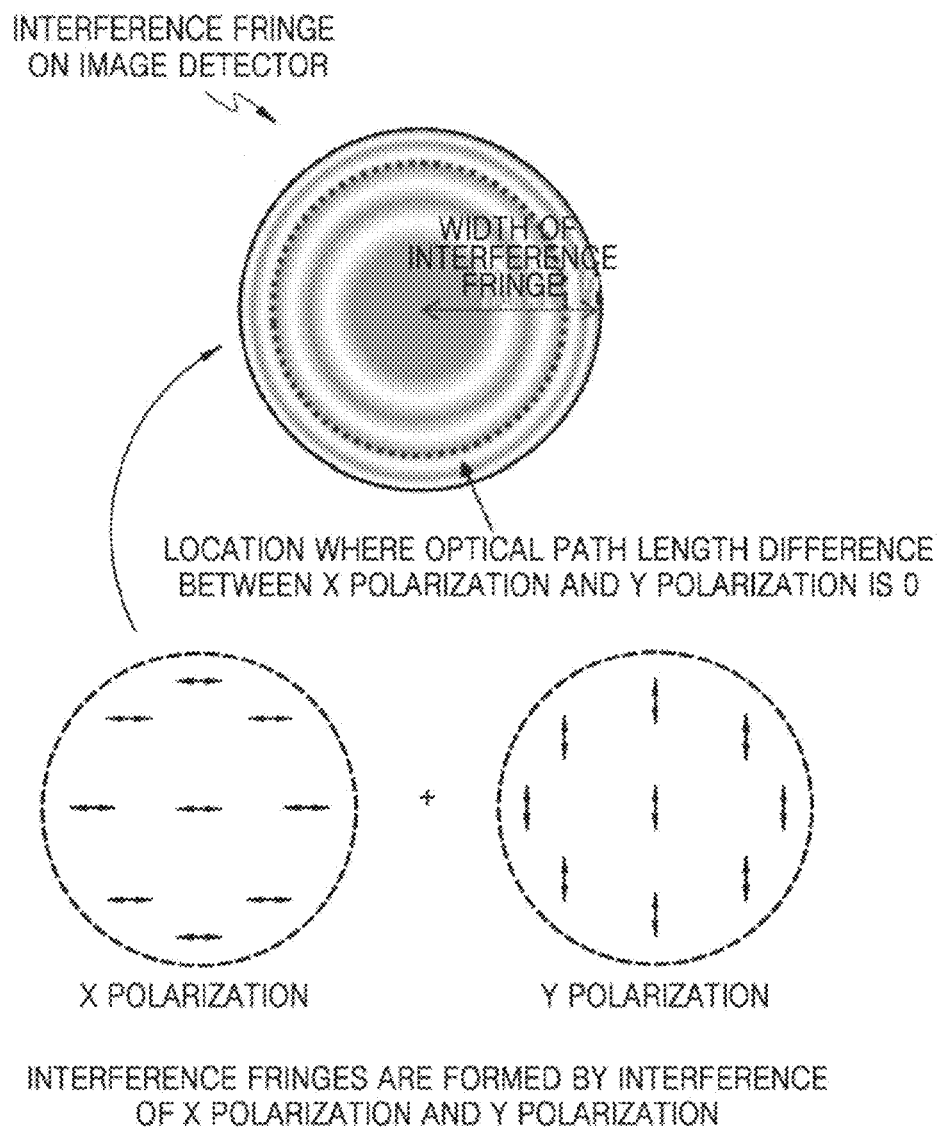
FIG. 6 is a photograph of reflected light interfering on an image detector in the ellipsometer of FIG. 4 with respect to an interference fringe, and conceptual diagrams of X polarization and Y polarization.

FIG. 6 is a photograph of an interference fringe of reflected light interfering on the image detector 42 in the ellipsometer 1 of FIG. 4, and conceptual diagrams of X polarization and Y polarization. FIG. 6 will be described with reference to FIG. 4.

Referring to FIG. 6, the interference fringe on the image detector 42 may have a shape of a concentric circle. In the ellipsometer 1 of the present example embodiment, such an interference fringe in the form of a concentric circle is called a Wollaston lens interference fringe. The Wollaston lens interference fringe may be formed by interference between X polarization and Y polarization. In the Wollaston lens interference fringe, a stripe space near the center may be large, and may be fine at the end of the pupil corresponding to light incident at the Brewster's angle. The Wollaston lens interference fringe may have a location where an optical path length difference between X polarization and Y polarization is 0 in a circular shape in a peripheral region of the image detector 42.

Figure 7:
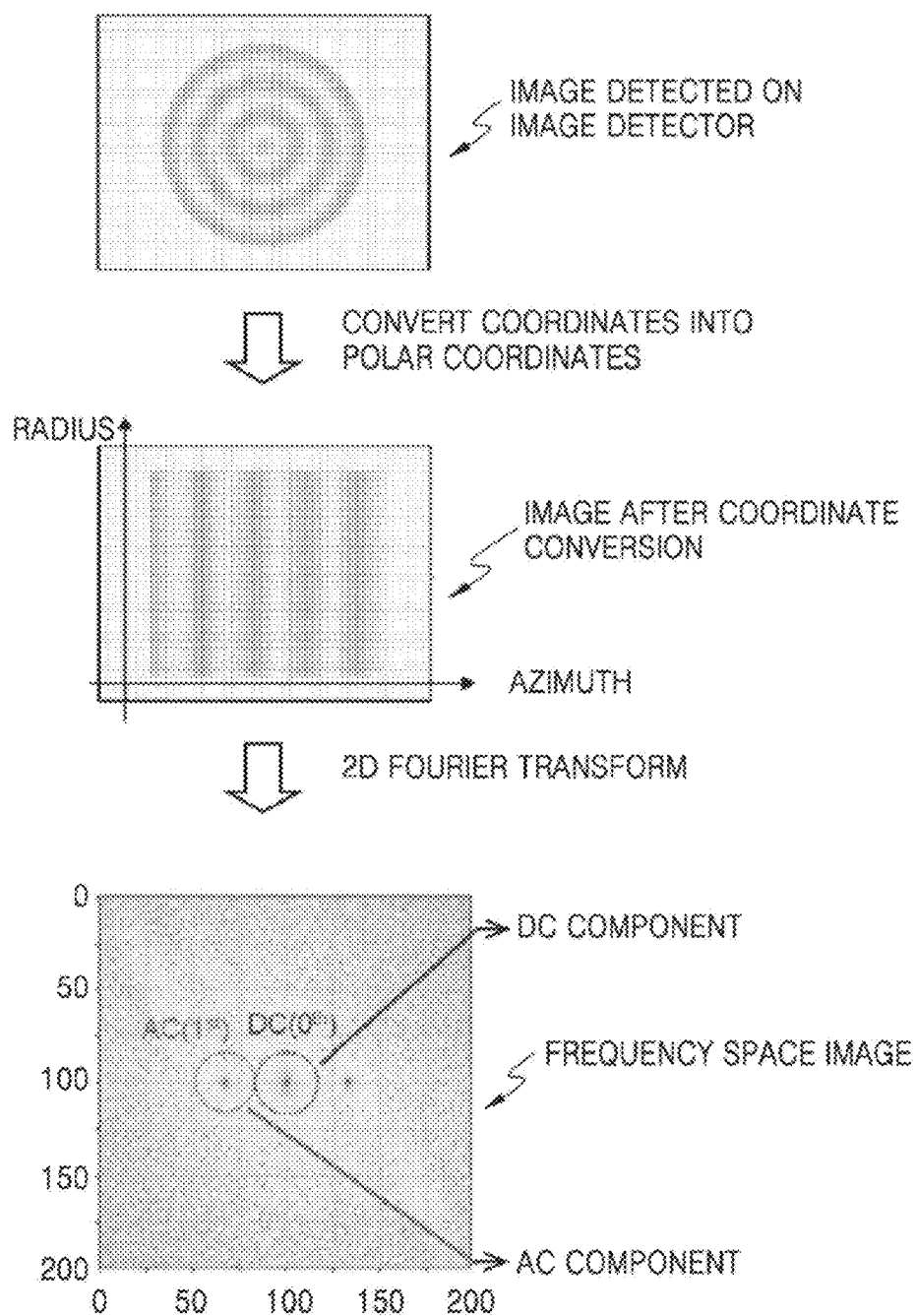

FIGS. 7 to 9 are conceptual diagrams of a method of analyzing an interference fringe of reflected light interfering on the image detector 42 in the ellipsometer 1 of FIG. 4. FIGS. 7 to 9 will be described with reference to FIG. 4.

Referring to FIG. 7, the analysis apparatus 43 may obtain an image detected on the image detector 42. The analysis apparatus 43 may convert the coordinates into polar coordinates so that the center of a concentric circle becomes a coordinate origin with respect to the obtained image including the interference fringe in the form of a concentric circle of point symmetry. Next, the analysis apparatus 43 may represent the image after coordinate conversion in two-dimensional (2D) coordinates having a radius and an azimuth (polar angle) of a polar coordinate system as axes. The analysis apparatus 43 may perform a 2D Fourier transform on an image on a 2D coordinate plane, divide the frequency space image after transformation into a DC component and an AC component, and trim the components.

Referring to FIG. 8, the analysis apparatus 43 may perform an inverse Fourier transform on the DC component after shifting a peak location to the coordinate origin. In addition, as shown in FIG. 9, the analysis apparatus 43 may perform an inverse Fourier transform on the AC component after shifting the peak location to the coordinate origin. The analyzer 43 may obtain a first AC component, which is an amplitude component, and a second AC component, which is a phase component from the AC component. The obtained second AC component may correspond) to Δ of ellipsometry measurement as it is, Ψ of ellipsometry measurement may be calculated from Equation (1) below. Here, DC represents a DC component, and AC amplitude represents the second AC component. As described above, the analysis apparatus 43 may calculate the ellipsometry coefficients Ψ and Δ from the detected interference fringes based on a result of the inverse Fourier transform.

$$\Psi = \tan^{-1}[DC/AC\ amplitude \pm \sqrt{\{(DC/AC\ amplitude)^2 - 1\}}] \quad \text{Equation (1)}$$

Hereinafter, the effect of the ellipsometer 1 of the present example embodiment will be described.

Figure 10:
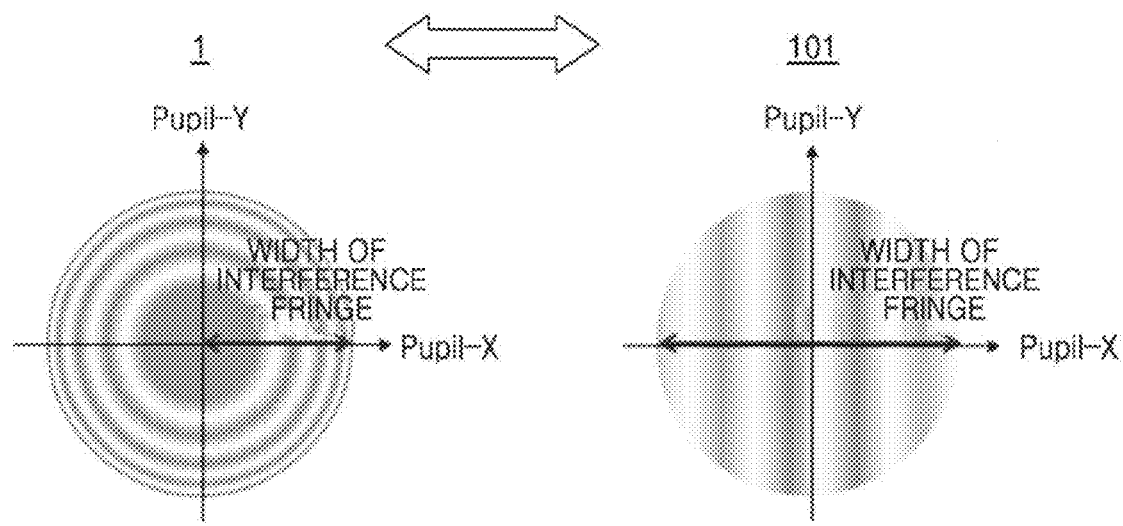
FIG. 10 is photographs of interference fringes of reflected light interfering on an image detector in the ellipsometer of FIG. 4 and the ellipsometer of FIG. 1.

FIG. 10 is photographs of interference fringes of reflected light interfering on an image detector in the ellipsometer 1 of FIG. 4 and the ellipsometer 101 of FIG. 1. FIG. 10 will be described with reference to FIGS. 1 and 4.

Referring to FIG. 10, in the ellipsometers 1 and 101 using the interference fringes of the present example embodiment and the comparative example, respectively, light used tor measurement may be partial coherent light temporally and spatially. Therefore, in a place where an optical path length difference of two interfering polarized light increases, the contrast of the interference fringes may significantly deteriorate. For this reason, the number of interference fringes firmed in the pupil has an upper limit depending on a wavelength width and/or a field of view.

As shown in FIG. 10, in order to compare the first interference fringes in the form of a concentric circle formed in the ellipsometer 1 of the present example embodiment and the second interference fringes formed in the ellipsometer 101 of the comparative example, for example, both the first and second interference fringes have the same number of snipes of about 5. Then, in the ellipsometer 101 of the comparative example, the interference fringes may be equally spaced within the pupil. On the other hand, in the ellipsometer 1 of the present example embodiment, the interference fringes may be sparse near the center and dense near the periphery. In addition, the width including the same five interference fringes may correspond to a pupil diameter in the ellipsometer 101 of the comparative example, but may correspond to a pupil radius in the ellipsometer 1 of the present example embodiment. Accordingly, the ellipsometer 1 of the present example embodiment may arrange the interference fringes twice as densely as the ellipsometer 101 of the comparative example. For example, near the periphery of the pupil, the interference fringes may be formed several to ten times as densely as possible.

Hereinafter, the technical advantages and/or effects of the pupil in ellipsometry measurement is described.

Figure 11:
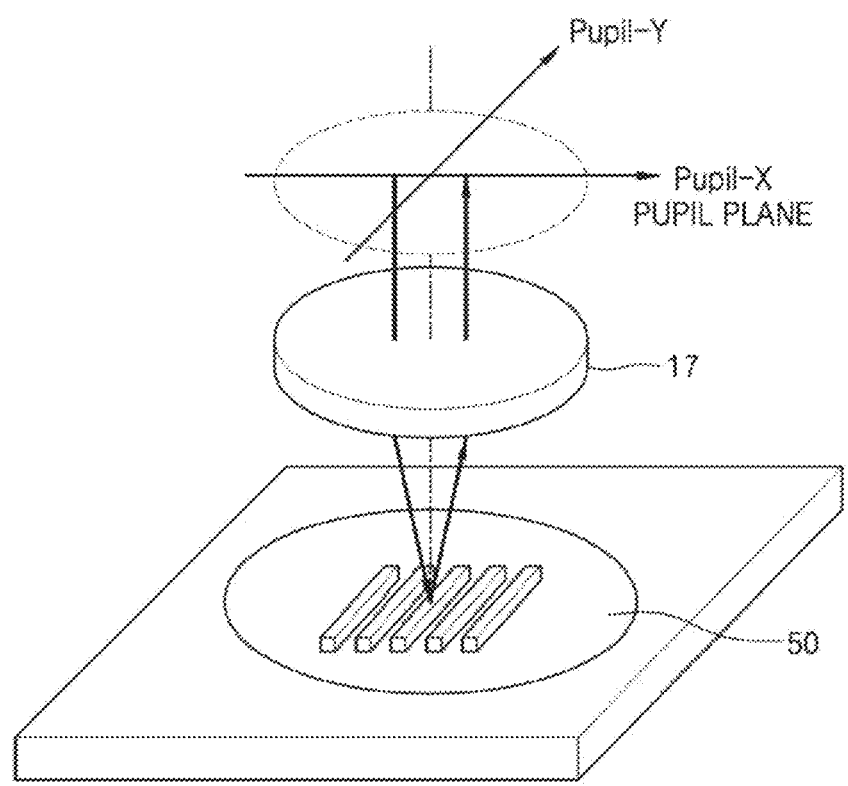
FIG. 11 is a perspective view showing an arrangement of an illumination optical system a condensing optical system, and a pupil plane in the ellipsometer of FIG. 4.

FIG. 11 is a perspective view showing an arrangement of an illumination optical system, a condensing optical system, and a pupil plane in the ellipsometer 1 of FIG. 4, and shows a relationship between a location on the pupil plane, and an angle of incidence of light and an azimuth of incidence to the sample 50. FIG. 11 will be described with reference to FIG. 4.

Referring to FIG. 11, the light perpendicularly incident on the sample 50 may arrive near the center of the pupil. On the other hand, near the periphery of the pupil, the light incident on the sample 50 at a large angle of incidence may arrive. In ellipsometry measurements, the obliquely incident light of the latter may be more important. For example, ellipsometry measurement using the illumination light L1 near the Brewster's angle having an angle of incidence of 60° to 75° may have the highest sensitivity. Further, because the illumination light L1 having such an angle of incidence has a large dependence on the angle of incidence and the azimuth of incidence, the illumination light L1 may be measured with relatively high resolution.

Figure 12:
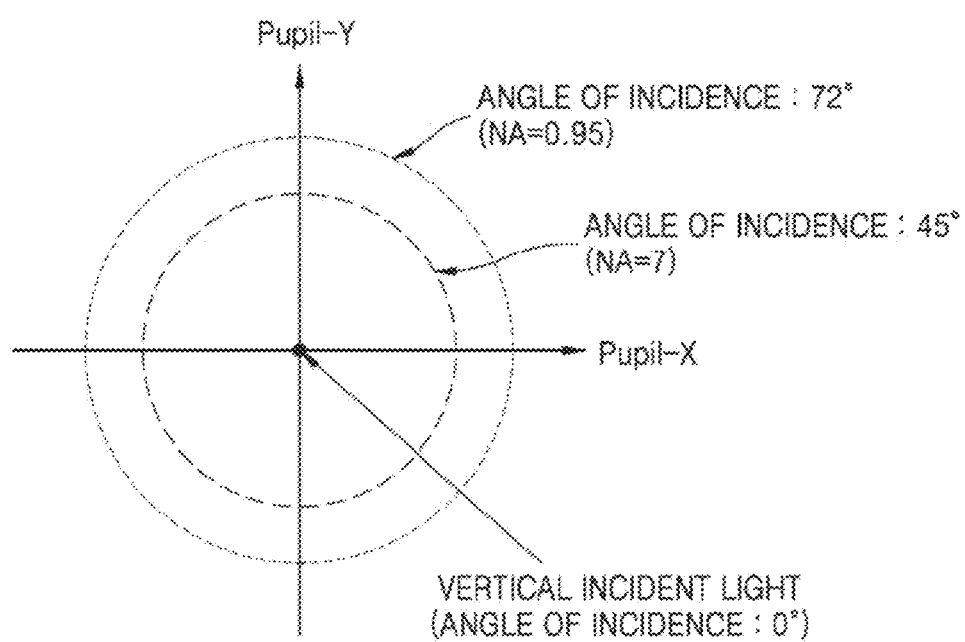
FIG. 12 is a conceptual diagram showing a relationship between a location on a pupil plane, an angle of incidence of light to a sample, and an azimuth of incidence in the ellipsometer of FIG. 4.

FIG. 12 is a conceptual diagram showing a relationship between a location on a pupil plane, and an angle of incidence of light and an azimuth of incidence to a sample in the ellipsometer 1 of FIG. 4. FIG. 12 will be described with reference to FIG. 4.

Referring to FIG. 12, NA=0.95, which is the upper limit of an NA of the general objective lens 17, may correspond to an angle of incidence of 72°, and may substantially include the Brewster angle. NA=0.7 may correspond to an angle of incidence of 45°. The ellipsometer 1 of the present example embodiment may form a dense interference fringe near the periphery on the pupil because the periphery is more important for ellipsometry measurements. Therefore, for example, in high-precision measurement of a semiconductor manufacturing process, the ellipsometer 1 may be widely used.

As described above, the ellipsometer 1 of the present example embodiment may have a characteristic measurement principle for calculating $\Psi$ and $\Delta$ from an interference fringe in the form of a concentric circle formed as two different polarized pieces of light. For example, in the case of performing spectral ellipsometry measurement by combining a broadband light source and a spectrometer, the resolution of the pupil may improve and the amount of light may increase, and thus a measurement time may shorten. Accordingly, a throughput may improve while a measurement precision improves.

Figure 13:
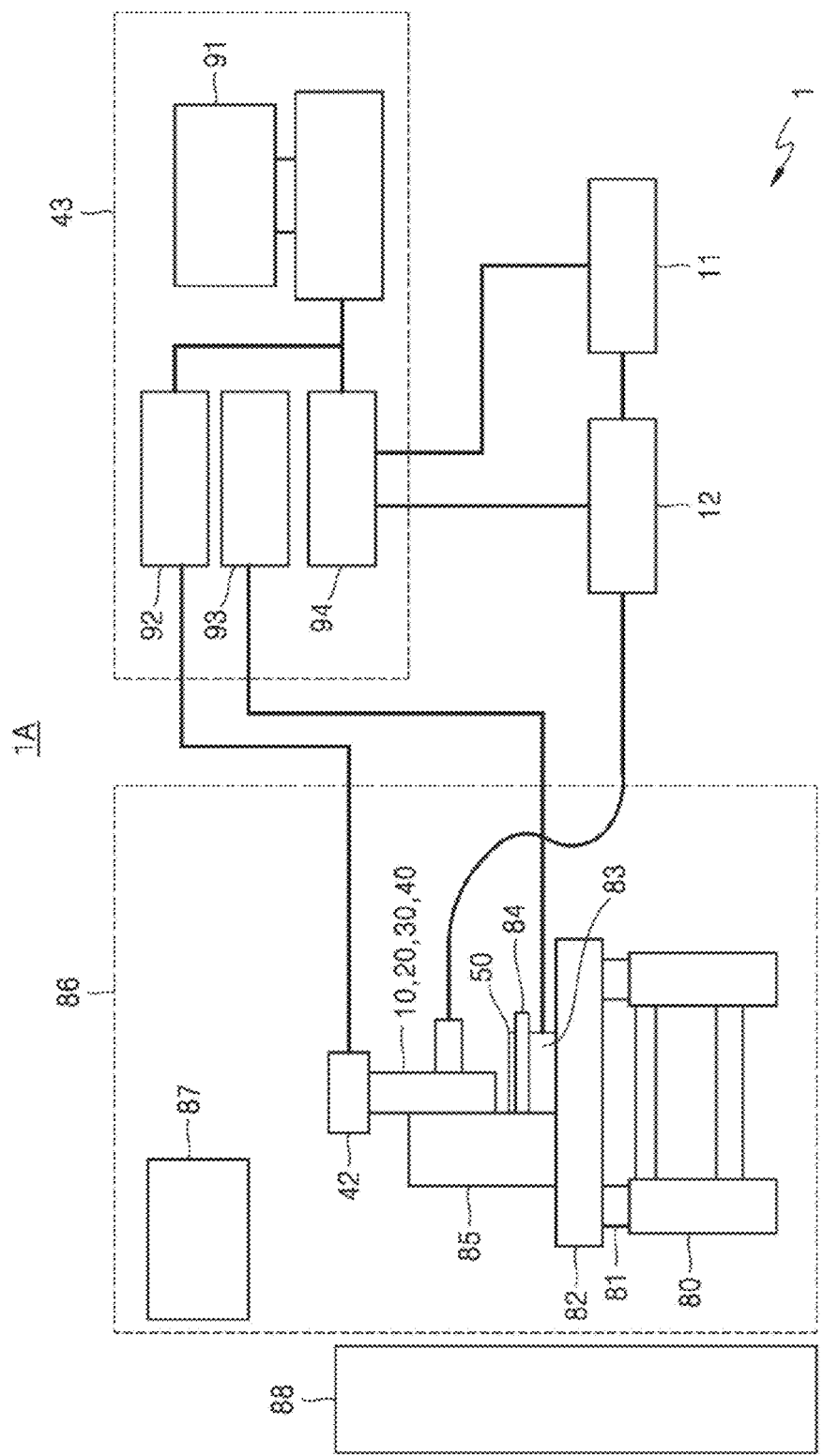
FIG. 13 is a configuration diagram schematically illustrating an apparatus for inspecting a semiconductor device including an ellipsometer according to an example embodiment of the inventive concepts.

FIG. 13 is a configuration diagram schematically illustrating an apparatus 1A for inspecting a semiconductor device including the ellipsometer 1 according to an example embodiment of the inventive concepts. FIG. 13 will be described with reference to FIG. 1, and the descriptions already given with reference to FIGS. 1 to 12 will be briefly provided or omitted.

Referring to FIG. 13, the apparatus 1A for inspecting the semiconductor device including the ellipsometer 1 of the present example embodiment (hereinafter, simply referred to as 'apparatus 1A for inspecting the semiconductor device') may include the ellipsometer 1, a base 80, and an isolator 81, an optical surface plate 82, a stage 83, a wafer holder 84, a frame 85, an environment chamber 86, a temperature controller unit 87, and an automatic substrate transfer device 88. The ellipsometer 1 may be, for example, the ellipsometer 1 of FIG. 4. Accordingly, the ellipsometer 1 may include the illumination optical system 10, the condensing optical system 20, the polarizing optical element unit 30, and the light receiving optical system 40.

The base 80 may be a pedestal serving as a foundation. The isolator 81 installed on the base 80 may remove vibration from the floor. The optical surface plate 82 may be installed on the isolator 81. The stage 83 and the frame 85 may be disposed on the optical surface plate 82. The sample 50, such as a silicon (Si) wafer mounted on the wafer holder 84, may be mounted on the stage 83. The frame 85 may fix an optical system. The environment chamber 86 may isolate several members of the ellipsometer 1 (e.g., the base 80, the isolator 81, the optical surface plate 82, the stage 83, the wafer holder 84, and the frame 85) from an external environment. Meanwhile, in FIG. 13, the light source 11 and the spectrometer 12 of the illumination optical system 10, and the analysis apparatus 43 that are not included in the environment chamber 86 are separately illustrated outside the environment chamber 86. The temperature controller unit 87 may maintain the inside of the environment chamber 86 at a certain temperature. The automatic substrate transfer device 88 may transfer the sample 50.

The analysis apparatus 43 of the ellipsometer 1 may acquire an image from the image detector 42, such as a camera, and may perform processing of ellipsometry measurement. The analysis apparatus 43 may include a control unit 91, such as a computer or processing, circuitry, a grabber board 92 that acquires and processes an image from the image detector 42, a stage controller 93 that controls the stage 83 on which the sample 50 is mounted, and a light source-spectrometer controller 94 that controls the light source 11 and the spectrometer 12. In other words, the analysis apparatus 43 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The apparatus 1A for inspecting the semiconductor device of the present example embodiment may include the ellipsometer 1 of FIG. 4. Accordingly, the apparatus 1A for inspecting the semiconductor device may improve a measurement accuracy and improve a throughput in the inspection of the semiconductor device. For example, in CD measurement and overlay evaluation in the semiconductor manufacturing process, the apparatus 1A for inspecting the semiconductor device may perform even distribution evaluation within a shot on a wafer, within a chip, and within a memory-cell, instead of measuring several points within a single wafer so far. Thereby, the apparatus 1A for inspecting the semiconductor device may contribute to improving a manufacturing yield and productivity of the semiconductor device, and may also contribute to cost reduction of the semiconductor device. Other configurations and effects are the same as those described with respect to the ellipsometer 1 of FIG. 4.

Figure 14:
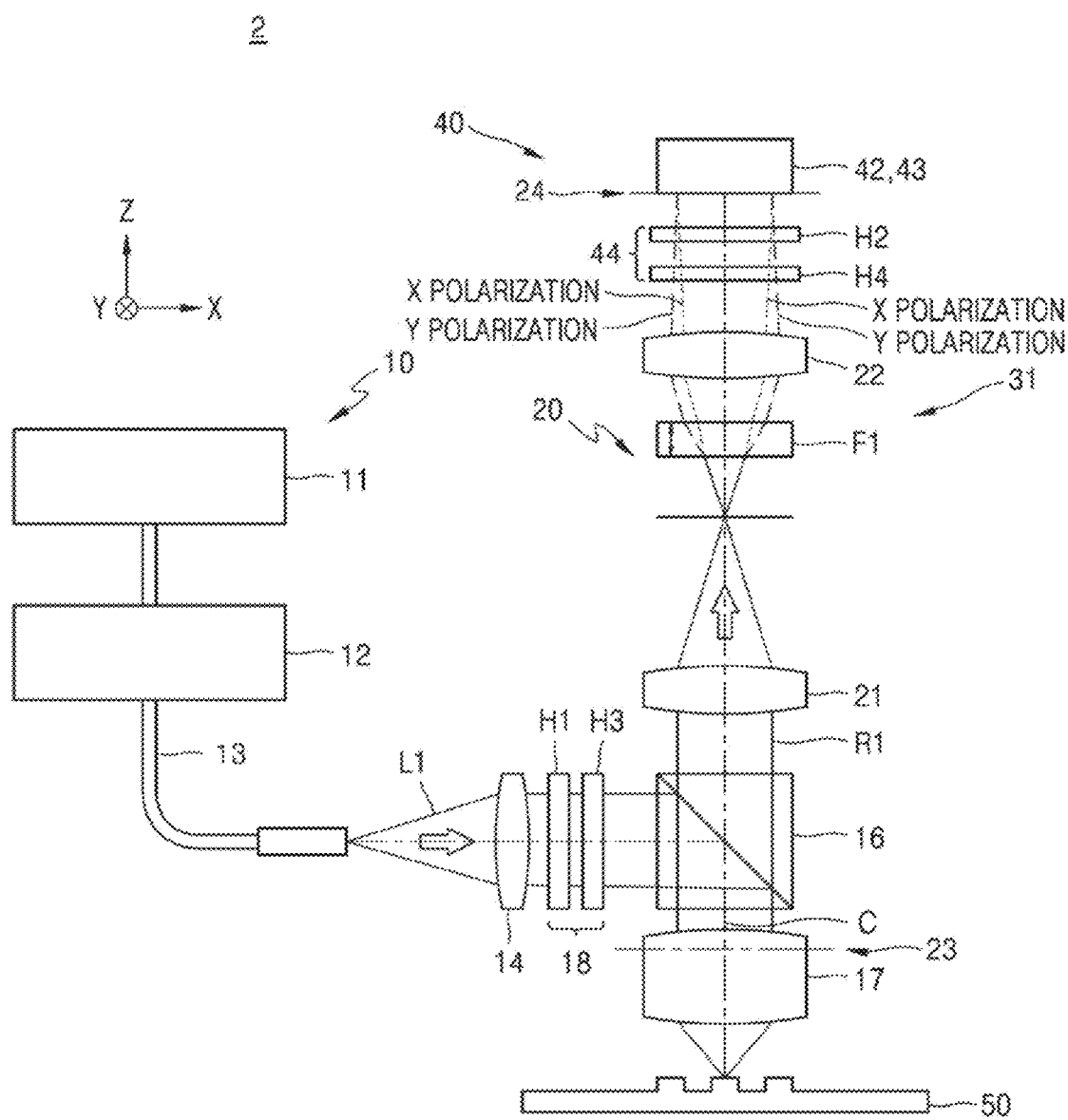
FIG. 14 is a configuration diagram schematically showing an ellipsometer according to an example embodiment of the inventive concepts.

FIG. 14 is a configuration diagram schematically showing an ellipsometer 2 according to an example embodiment of the inventive concepts. The descriptions already given with reference to FIGS. 1 to 12 will be briefly provided or omitted.

Referring to FIG. 14, the ellipsometer 2 of the present example embodiment may be different from the ellipsometer 1 of FIG. 4 in that illumination light L1 including circular polarization is used. For example, the ellipsometer 2 of the present example embodiment may include a polarizer unit 18. The polarizer unit 18 may include a circular polarizer that generates the circular polarization that rotates in any one of a left rotation and a right rotation with respect to an optical axis of the illumination light L1. The circular polarizer of the polarizer unit 18 may include a linear polarizer H1 and a $\lambda/4$ wave plate H3.

In addition, the ellipsometer 2 of the present example embodiment may include an analyzer unit 44. The analyzer unit 44 may include a circular polarizer that transmits a circular polarization component that rotates in any one of a left rotation and a right rotation. The circular polarizer of the analyzer unit 44 may include a linear polarizer H2 and a $\lambda/4$ wave plate H4.

Furthermore, the ellipsometer 2 of the present example embodiment may include a polarizing optical element unit 31. The polarizing optical element unit 31 may include a birefringent crystal F1. The birefringent crystal F1 may be disposed at a location where the reflected light R1 is condensed or diffused in the condensing optical system 20. For example, the birefringent crystal F1 may be disposed between the lower relay lens 21 and the upper relay lens 22 at a location where the reflected light R1 diffuses. The birefringent crystal F1 may have a parallel plane plate shape. Accordingly, the birefringent crystal F1 may include two parallel plate surfaces. The birefringent crystal F1 may be a uniaxial birefringent crystal. A crystal optical axis of the birefringent crystal F1 may be disposed in a direction orthogonal to a plate surface. The birefringent crystal F1 may be disposed so that the plate plane is orthogonal to the optical axis. Accordingly, the crystal optical axis of the birefringent crystal F1 may be parallel to the optical axis C of the condensing optical system 20. The birefringent crystal F1 may include, for example, αBB) as a material. In addition, the birefringent crystal F1 may include any one of quartz, magnesium fluoride, sapphire, or calcite.

In the ellipsometer 2 of the present example embodiment, the illumination light L1 converted into parallel light by the illumination lens 14 includes linear polarization while transmitting through the linear polarizer H1. Thereafter, the illumination light L1 including the linear polarization may become the illumination light L1 including the circular polarization by transmitting through the λ/4 wave plate H3. Also, according to an example embodiment, the illumination light L1 may include elliptical polarization.

The illumination light L1 may transmit through the objective lens 17 via the beam splitter 16. Thereby, the illumination light L1 may illuminate the sample 50 from all angles and all azimuths within an NA of the objective lens 17. In this case, the NA of the objective lens 17 may be greater than or equal to a value including the Brewster angle of the sample 50.

The reflected light R1 reflected from the sample 50 may include radial polarization and azimuth polarization. The reflected light R1 may transmit through the pupil location 23 of the objective lens 17. The pupil conjugation location 24, which is conjugate with the pupil location 23, may be imaged on the image detector 42 by the relay lenses 21 and 22.

Figure 15:
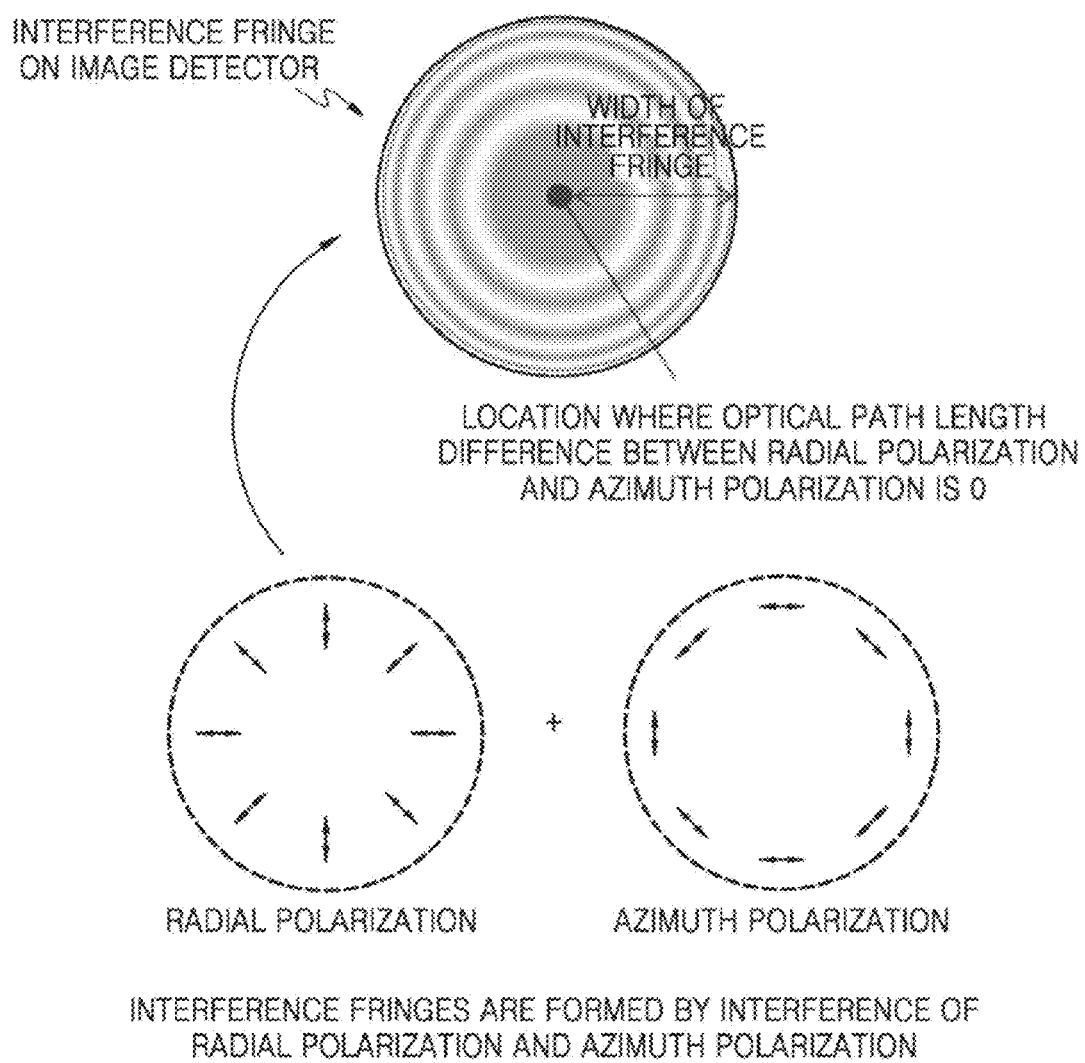
FIG. 15 is a photograph of an interference fringe of reflected light interfering on an image detector in the ellipsometer of FIG. 14, and conceptual diagrams of radial polarization and the azimuth polarization.

FIG. 15 is a photograph of an interference fringe of reflected light interfering on an image detector in the ellipsometer 2 of FIG. 14, and conceptual diagrams of radial polarization and azimuth polarization. FIG. 15 will be described with reference to FIG. 14.

Referring to FIG. 15, the action when the radial polarization and azimuth polarization included in the reflected light R1 transmit through the birefringent crystal F1 is considered. First, the azimuth polarization is always perpendicular to a crystal optical axis of the birefringent crystal F1. Accordingly, the azimuth polarization may be ordinary light. Meanwhile, in the radial polarization, a polarization direction is inclined with respect to the optical axis C. For this reason, radial polarization may include extraordinary light in which an electric field is parallel to the crystal optical axis of the birefringent crystal F1.

Figure 16:
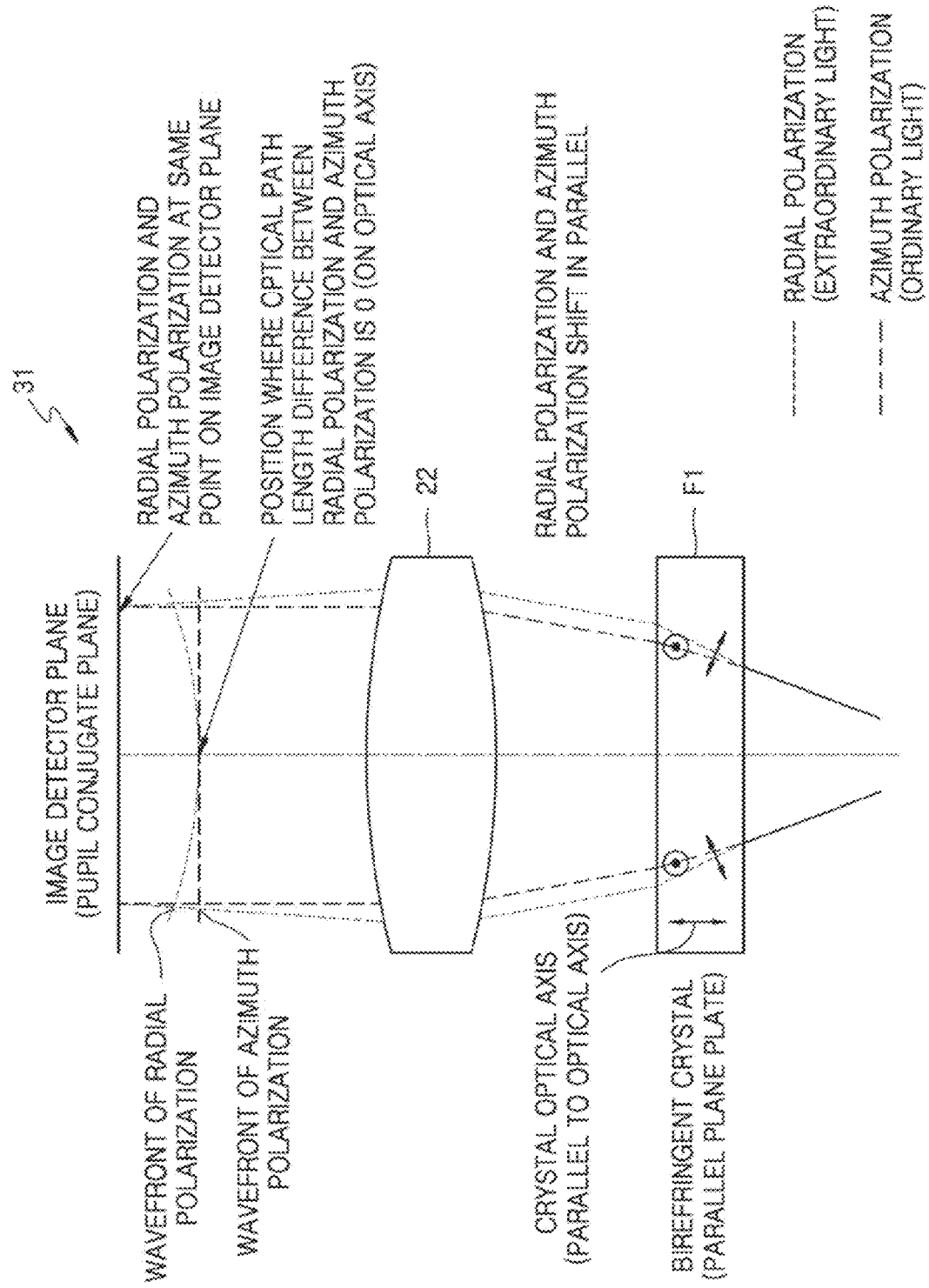
FIG. 16 is a conceptual diagram of a polarizing optical element unit in the ellipsometer of FIG. 14.

FIG. 16 is a conceptual diagram of the polarizing optical element unit 31 in the ellipsometer 2 of FIG. 14, in which the linear polarizer H2 and the λ/4 wave plate H4 of the analyzer unit 44 are omitted, to explain a propagation state of each of radial polarization and azimuth polarization.

Referring to FIG. 16, in the polarizing optical element unit 31 of the ellipsometer 2 of the present example embodiment, the radial polarization and azimuth polarization that transmit through the birefringent crystal F1 may be relatively different in a traveling direction and a phase according to a difference in refractive index. That is, the radial polarization including extraordinary light may be diffused in a direction away from the optical axis C than the azimuth polarization including ordinary light. Meanwhile, after transmitting through the birefringent crystal F1, radial polarization and azimuth polarization may be shifted parallel to each other.

Then, after transmitting through the upper relay lens 22, radial polarization and azimuth polarization may return to the same point on the image detector 42 (On the pupil). Here, it should be noted that a phase difference between two polarizations is also delayed by a different amount. On the optical axis C, radial polarization and azimuth polarization are in the same phase, but the phase may be different toward the periphery of the image detector 42 (on the pupil).

The analyzer unit 44 including the λ/4 wave plate H4 and the linear polarizer H2 may be disposed between the image detector 42 and the upper relay lens 22. The analyzer unit 44 may transmit only a common polarization component of radial polarization and azimuth polarization. Accordingly, the radial polarization and azimuth polarization transmitted through the analyzer unit 44 may cause interference, and thus, an interference fringe in the form of a concentric circle may be formed on the image detector 42. Here, the radial polarization may correspond to P polarization on the sample 50, such as a semiconductor wafer, for example, and the azimuth polarization may correspond to S polarization on the sample 50. Accordingly, the ellipsometer 2 of the present example embodiment may enable ellipsometry measurement on the P polarization and S polarization in all directions, and enable high-sensitivity measurement due to its symmetry without depending on a structure of a measurement target. Other configurations and effects are the same as those described with respect to the ellipsometer 1 of FIG. 4 and the apparatus 1A for inspecting the semiconductor device of FIG. 13.

Figure 17:
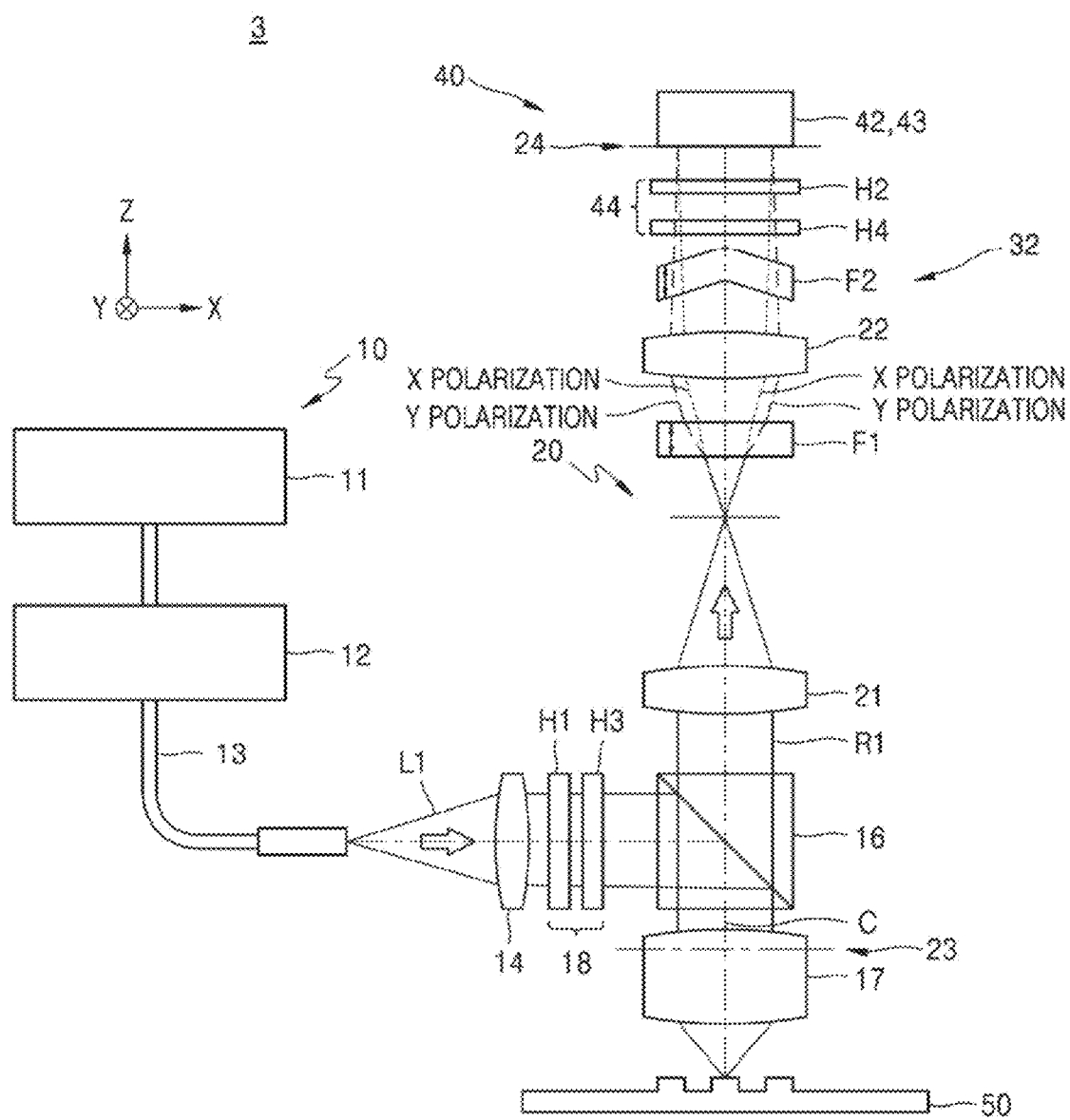
FIG. 17 is a configuration diagram schematically showing an ellipsometer according to an example embodiment of the inventive concepts.

FIG. 17 is a configuration diagram schematically showing an ellipsometer 3 according to an example embodiment of the inventive concepts. The descriptions already given with reference to FIGS. 1 to 16 will be briefly provided or omitted.

Referring to FIG. 17, in the ellipsometer 2 of FIG. 14, a location where an optical path length difference between radial polarization and azimuthal polarization is 0 is on the optical axis C of the condensing optical system 20. Meanwhile, in the ellipsometer 3 of the present example embodiment, the location where the optical path length difference between the radial polarization and the azimuth polarization is 0 may be arranged more peripherally on the pupil, whereby the number of stripes in the interference fringe may be densely measured.

For example, the ellipsometer 3 of the present example embodiment may include a polarizing optical element unit 32. The polarizing optical element unit 32 may include an upper birefringent crystal F2 in addition to the lower birefringent crystal F1. The upper birefringent crystal F2 may be disposed between the upper relay lens 22 and the analyzer unit 44. The upper birefringent crystal F2 has a plate shape having an incident surface and an exit surface. The incident surface may have a concave cone shape and the exit surface may have a convex cone shape. The upper birefringent crystal F2 may have a double-sided axicon lens shape. The upper birefringent crystal F2 may include a uniaxial birefringent crystal. The crystal optical axis of the upper birefringent crystal F2 may be parallel to the optical axis C of the condensing optical system 20.

The upper birefringent crystal F2 may have a birefringence opposite to that of the lower birefringent crystal F1. For example, the lower birefringent crystal F1 and the upper birefringent crystal F2 may have opposite birefringence of a refractive index $n_0$ of ordinary light (hereinafter referred to as $n_o$)< a refractive index $n_e$ of extraordinary light (hereinafter referred to as $n_e$), and $n_o > n_e$. For example, when the lower birefringent crystal F1 is a negative crystal ($n_o > n_e$), the upper birefringent crystal F2 may be a positive crystal ($n_o < n_e$). Conversely, when the lower birefringent crystal H is the positive crystal ($n_o < n_e$) the upper birefringent crystal F2 may be the negative crystal ($n_o > n_e$).

Figure 18:
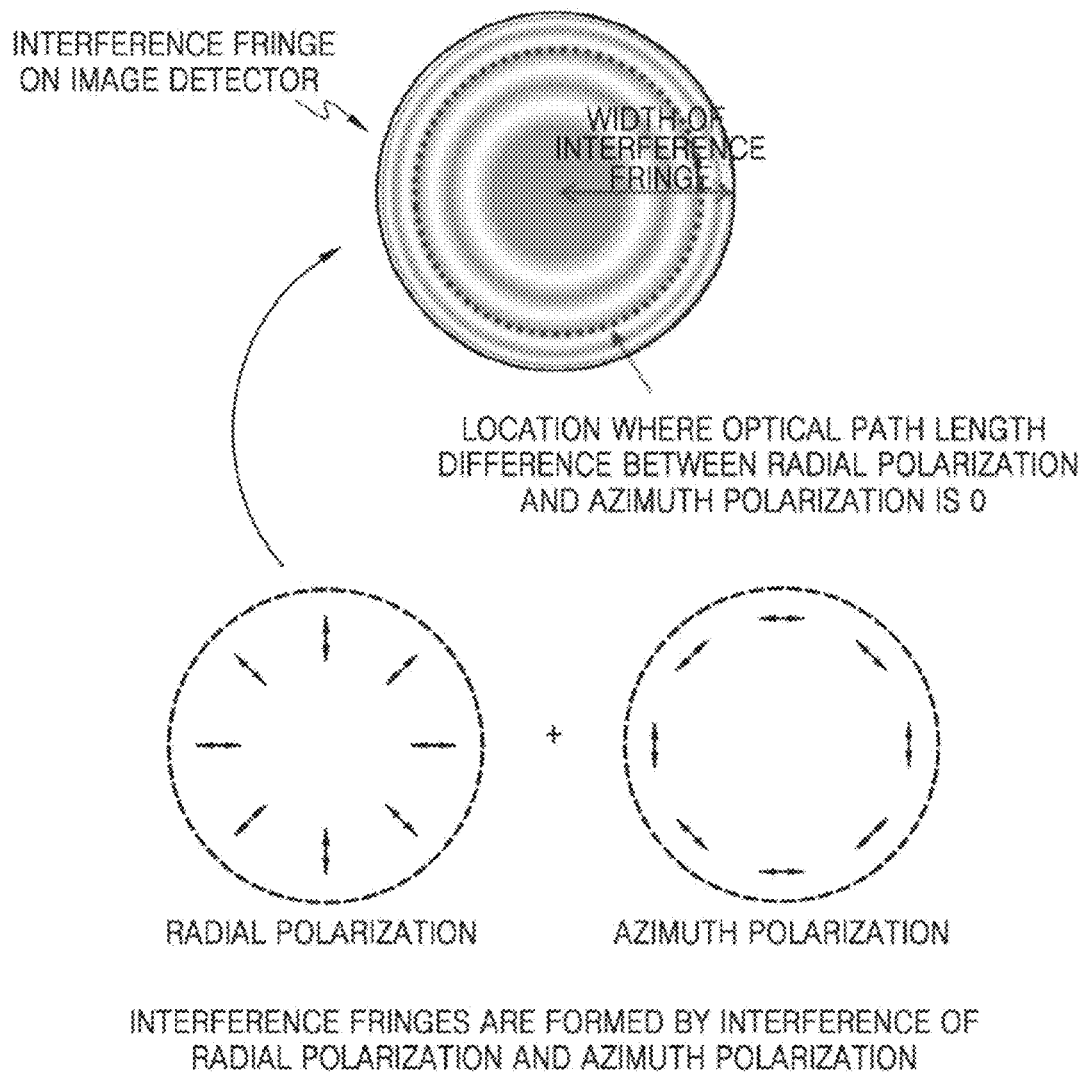
FIG. 18 is a photograph of an interference fringe of reflected light interfering on an image detector in the ellipsometer of FIG. 17, and conceptual diagrams of radial polarization and azimuth polarization.
Figure 19:
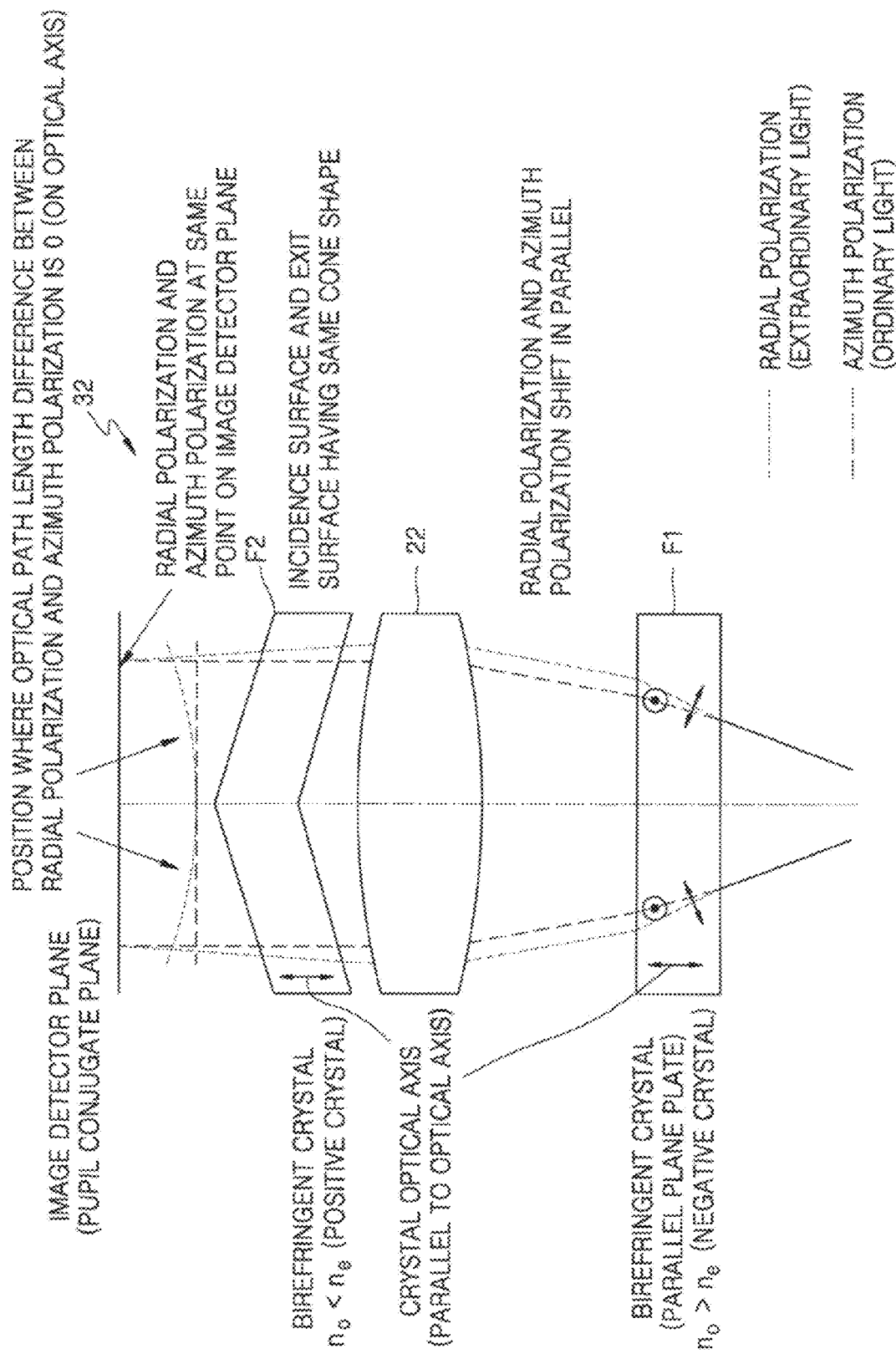
FIG. 19 is a conceptual diagram of a polarizing optical element ellipse of FIG. 17.

FIG. 18 is a photograph of an interference fringe of reflected light interfering on the image detector 42 in the ellipsometer 3 of FIG. 17, and conceptual diagrams of radial polarization and azimuth polarization, and FIG. 19 is a conceptual diagram of the polar zing optical element unit 32 in the ellipsometer 3 of FIG. 17.

Referring to FIGS. 18 and 19, by adding the upper birefringent crystal F2 to the lower birefringent crystal F1, on the image detector 42, a location where an optical path length difference between radial polarization and azimuth polarization is 0 may be, moved to a location outside the optical axis C. Meanwhile, in FIG. 19, the linear polarizer H2 and the λ/4 wave plate H4 of the analyzer unit 44 are omitted, in order to explain a propagation state of each of radial polarization and azimuth polarization.

FIGS. 20 to 23 are conceptual diagrams of polarizing optical element units 33 to 36 according to modification examples in the ellipsometer 3 of FIG. 17. FIGS. 20 to 23 will be described with reference to FIG. 17, and the descriptions already given with reference to FIGS. 17 to 19 will be briefly provided or omitted.

Even when the polarizing optical element units 33 to 36 of FIGS. 20 to 23 have a different configuration from that of the polarizing optical element unit 32 of FIG. 19, by the same principle as that of the polarizing optical element unit 32 of FIG. 19, interference fringes in the form of a concentric circle in radial polarization and azimuth polarization may be formed tiara the image detector 42.

Figure 20:
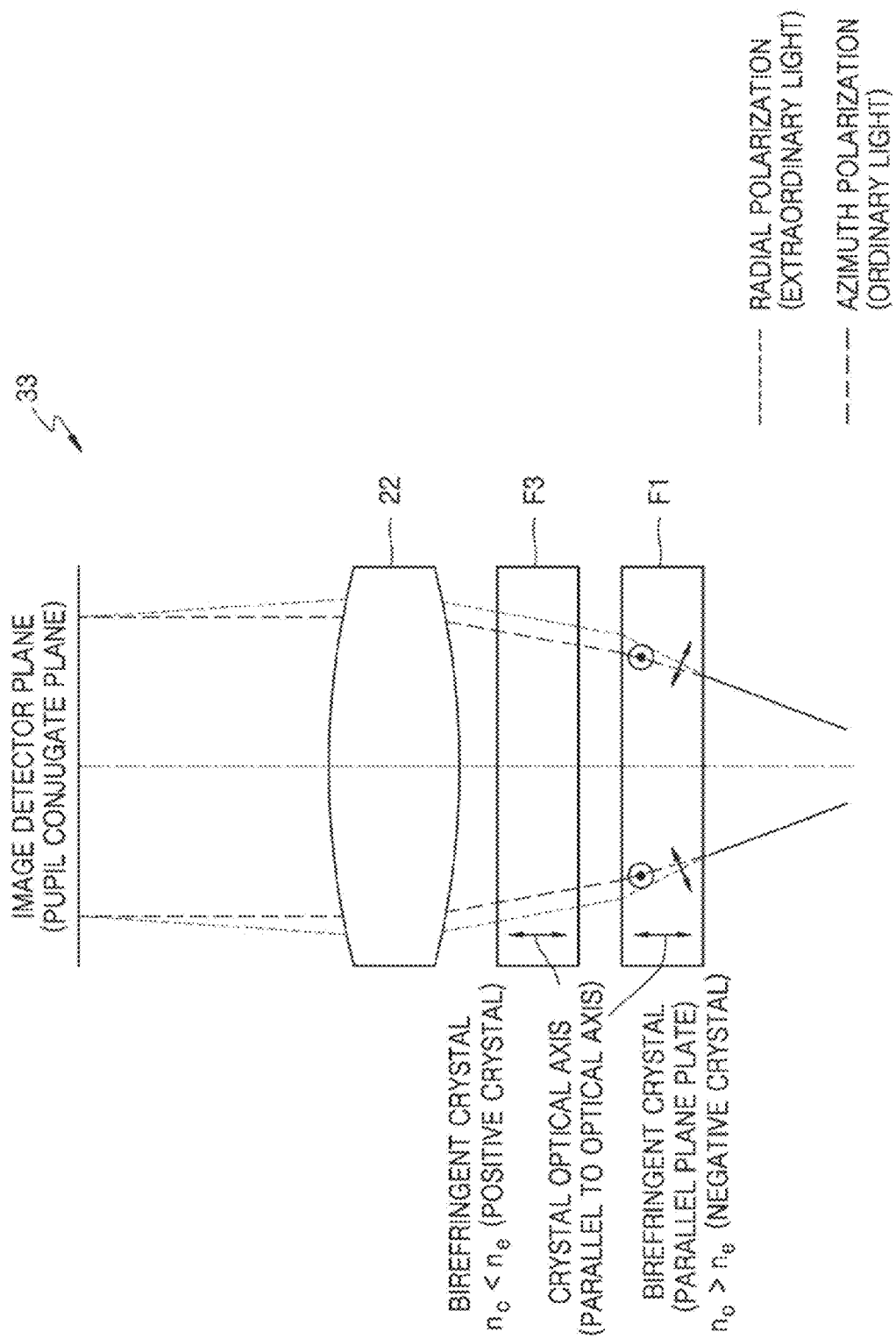
FIGS. 20 to 23 are conceptual diagrams of polarizing optical element units according to modification examples in the ellipsometer of FIG. 17.

Referring to FIG. 20, the polarizing optical element unit 33 according to a first modification example may include the lower birefringent crystal F1 and an upper birefringent crystal F3. For example, in the configuration of the polarizing optical element unit 32 of the ellipsometer 3 of FIG. 17, the polarizing optical element unit 33 of the first modification may omit the upper birefringent crystal 12, and the upper birefringent crystal F3 may be disposed between the lower birefringent crystal F1 and the upper relay lens 22. Accordingly, the upper birefringent crystal 13 may be disposed in a region where the reflected light R1 of the condensing optical system 20 is condensed or diffused. The upper birefringent crystal F3 may include a uniaxial birefringement crystal having a parallel plane plate shape. The upper birefringent crystal F3 may include two parallel plate surfaces. The crystal optical axis of the upper birefringent crystal F3 may be orthogonal to the plate surface. The upper birefringent crystal F3 may be disposed such that the plate surface thereof is orthogonal to the optical axis C of the condensing optical system 20. The crystal optical axis of the upper birefringent crystal F3 may be parallel to the optical axis C.

The upper birefringent crystal F3 may have a birefringence opposite to that of the lower birefringent crystal F1. For example, the lower birefringent crystal F1 and the upper birefringent crystal F3 may have opposite birefringence of $n_o < n_e$ and $n_o > n_e$. For example, when the lower birefringent crystal F1 is a negative crystal ($n_o > n_e$), the upper birefringent crystal F3 may be a positive crystal ($n_o < n_e$). Conversely, when the lower birefringent crystal F1 is the positive crystal ($n_o < n_e$), the upper birefringent crystal F3 may be the negative crystal ($n_o > n_e$).

Figure 21:
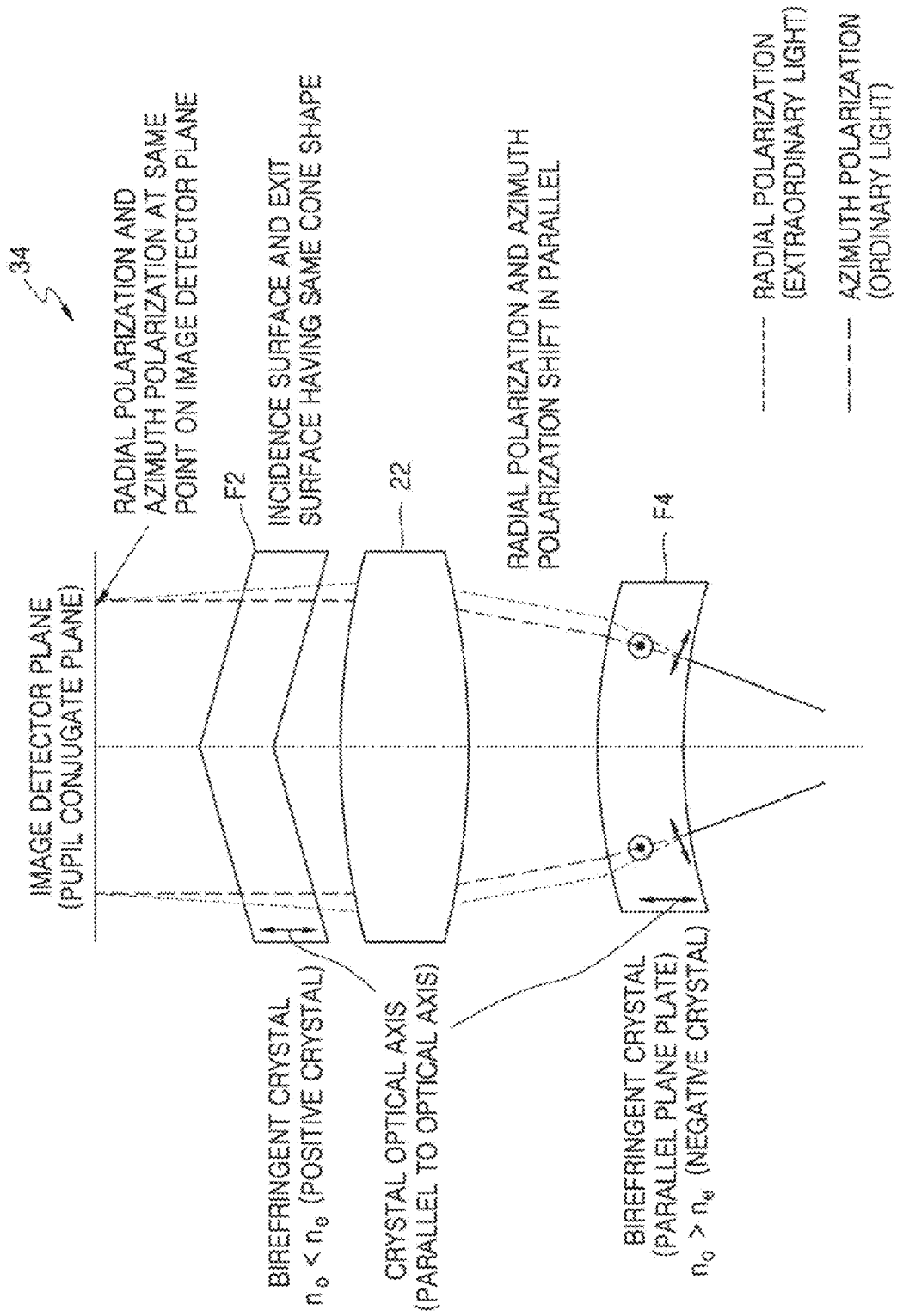

Referring to FIG. 21, the polarizing optical element unit 34 of a second modification example may include the upper birefringent crystal F2 having a double-sided axicon lens shape and a lower birefringent crystal F4 having a meniscus lens shape. For example, in the configuration of the polarizing optical element unit 32 of the ellipsometer 3 in FIG. 17, the polarizing optical element unit 34 of the second modification example may include the lower birefringent crystal F4 between the lower relay lens 24 and the upper relay lens 22, instead of the lower birefringent crystal F1. Accordingly, the lower birefringent crystal F4 may be disposed in a region where the reflected light R1 of the condensing optical system 20 is condensed or diffused. The lower birefringent crystal F4 may include an incident surface and an exit surface. The lower birefringent crystal F4 may have the incident surface having a concave spherical shape and the exit surface having a convex spherical shape. The lower birefringent crystal F4 may include a uniaxial birefringent crystal. The crystal optical axis of the lower birefringent crystal F4 may be arranged so as to be parallel to the optical axis C the condensing optical system 20.

The lower birefringent crystal F4 may have a birefringence opposite to that of the upper birefringent crystal F2. For example, the upper birefringent crystal F2 and the lower birefringent crystal F4 may have opposite birefringence of $n_o < n_e$ and $n_o > n_e$. For example, when the upper birefringent crystal F2 is a negative crystal ($n_o > n_e$), the lower birefringent crystal F4 may be a positive crystal ($n_o < n_e$). Conversely, when the upper birefringent crystal F2 is the positive crystal ($n_o < n_e$), the lower birefringent crystal F4 may be the negative crystal ($n_o > n_e$).

Figure 22:
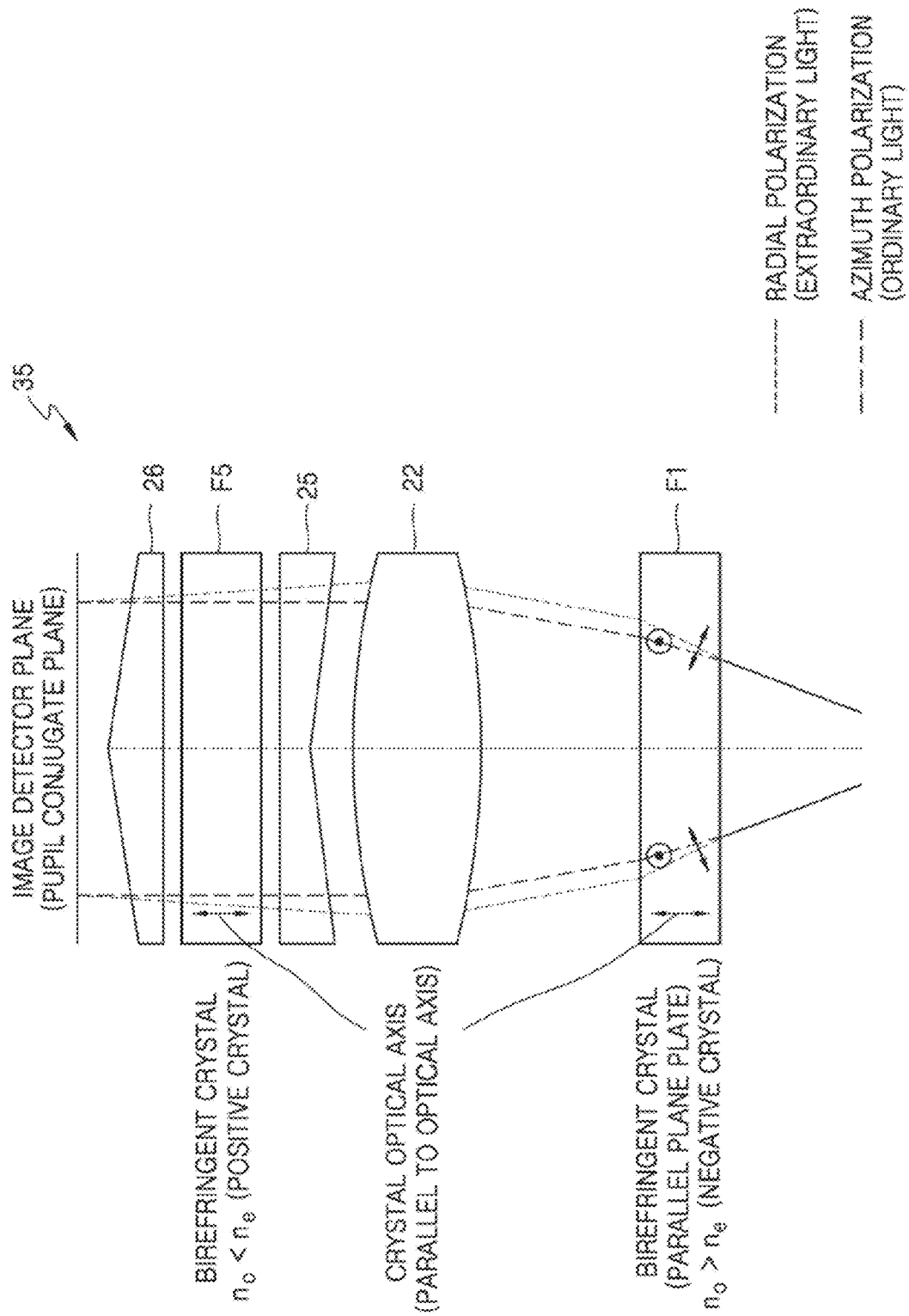

Referring to FIG. 22, the polarizing optical element unit 35 of the third modified example may include the lower birefringent crystal F1, an upper birefringent crystal F5, and axicon lenses 25 and 26. For example, in the configuration of the ellipsometer 3 in FIG. 17, the polarizing optical element unit 35 of a third modification example may have a configuration in which an upper birefringent crystal F5 having a parallel plane plate shape is disposed between the concave-convex axicon lenses 25 and 26, instead of the upper birefringent crystal F2 having a double-sided axicon lens shape. The upper birefringent crystal F5 may include a uniaxial birefringent crystal having the parallel plane plate shape. The upper birefringent crystal F5 may include two parallel plate surfaces. The crystal optical axis of the upper birefringent crystal F5 may be orthogonal to the plate surface. The upper birefringent crystal F5 may be disposed such that the plate surface thereof is orthogonal to the optical axis C of the condensing optical system 20. The crystal optical axis of the upper birefringent crystal F5 may be parallel to the optical axis C.

The lower axicon lens 25 may be disposed between the upper relay lens 22 and the upper birefringent crystal F5. Accordingly, the lower axicon lens 25 may be disposed on an incident surface side of the upper birefringent crystal F5. The lower axicon lens 25 may include, for example, glass, as a material. The lower axicon lens 25 may have an incident surface having a concave cone shape and an exit surface having a planar shape.

The upper axicon lens 26 may be disposed between the upper birefringent crystal F5 and the analyzer unit 44. Accordingly, the upper axicon lens 26 may be disposed on an exit surface side of the upper birefringent crystal F5. The upper axicon lens 26 may include, for example, glass, as a material. The upper axicon lens 26 may have an incident surface having a planar shape and an exit surface having a convex conical shape.

The upper birefringent crystal F5 may have a birefringence opposite to that of the lower birefringent crystal F1. For example, the lower birefringent crystal F1 and the upper birefringent crystal F5 may have opposite birefringence of $n_0 < n_e$ and $n_0 > n_e$. For example, when the lower birefringent crystal F1 is a negative crystal ($n_0 > n_e$), the upper birefringent crystal F5 may be a positive crystal ($n_0 < n_e$). Conversely, when the lower birefringent crystal F1 is the positive crystal ($n_0 < n_e$), the upper birefringent crystal F5 may be the negative crystal ($n_0 > n_e$).

Figure 23:
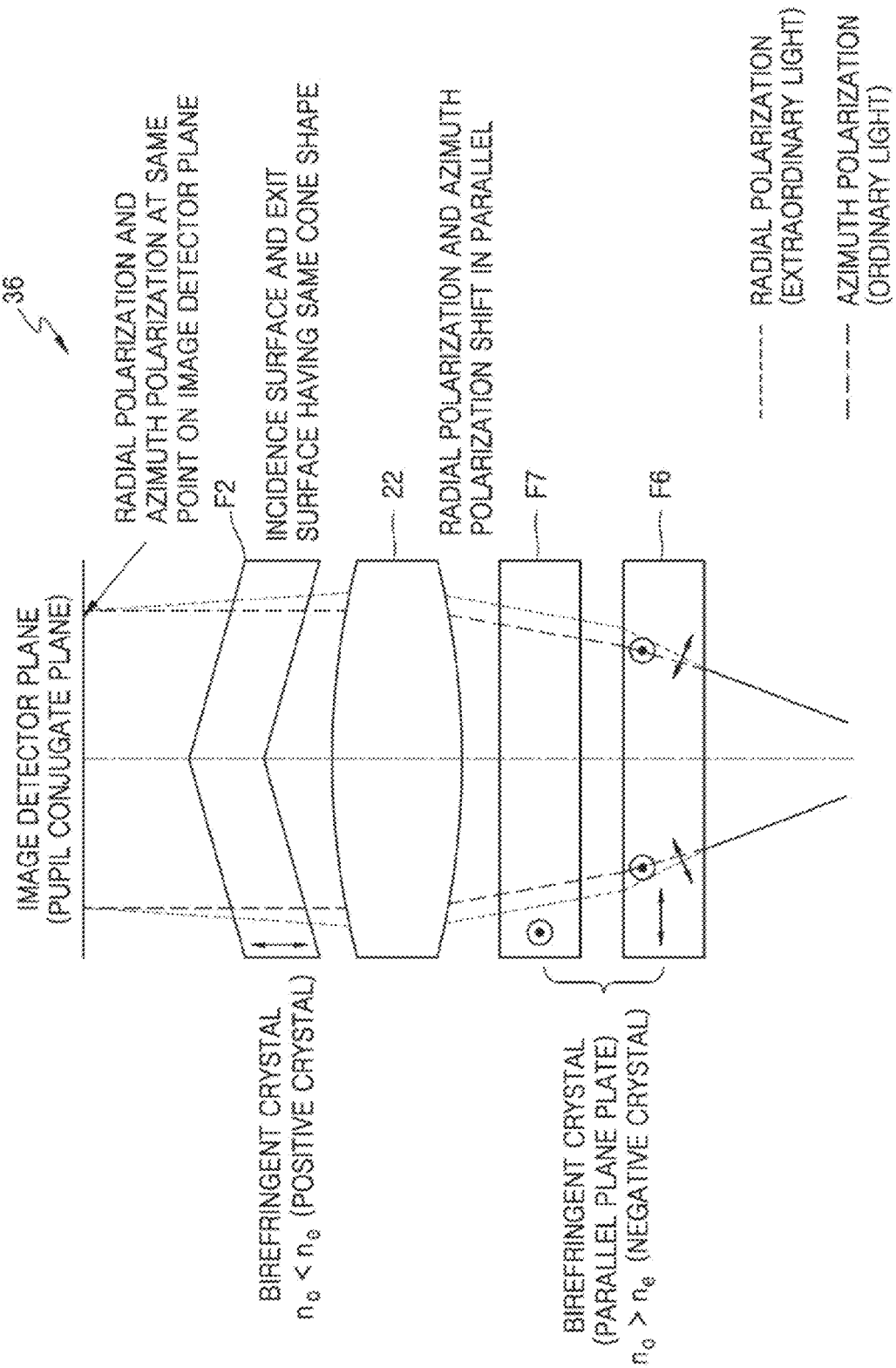

Referring to FIG. 23, the polarizing optical element unit 36 according to a fourth modification example may include the upper birefringent crystal F2, a lower birefringent crystal F6, and an intermediate birefringent crystal F7. For example, in the configuration of the ellipsometer 3 in FIG. 17, the polarizing optical element unit 36 of the fourth modification example may include the lower birefringent crystal F6 and the intermediate birefringement crystal F7, instead of the lower birefringent crystal F1. Accordingly, the lower birefringent crystal F6 and the intermediate birefringent crystal F7 may be disposed in a region where the reflected light R1 of the light converging optical system 20 is condensed or diffused. The lower birefringent crystal F6 and the intermediate birefringent crystal F7 may include a uniaxial birefringent crystal having a parallel plane plate shape. Each of the lower birefringent crystal F6 and the intermediate birefringent crystal F7 may include two parallel plate surfaces. The crystal optical axis of the lower birefringent crystal F6 and the crystal optical axis of the intermediate birefringent crystal F7 may be parallel to the plate surface. The lower birefringent crystal F6 and the intermediate birefringent crystal F7 may be disposed such that the plate surface is orthogonal to the optical axis C of the light converging optical system 20. The crystal optical axis of the lower birefringent crystal F6 and the crystal optical axis of the intermediate birefringent crystal F7 may be orthogonal to the optical axis C of the condensing optical system 20 and may be orthogonal to each other.

The lower birefringent crystal F6 and the middle birefringent crystal F7 may have opposite birefringence to that of the upper birefringent crystal F2. For example, the lower birefringent crystal F6 and the intermediate birefringent crystal F7, and the upper birefringent crystal F2 may have opposite birefringence of $n_0 < n_e$ and $n_0 > n_e$. For example, when the lower birefringent crystal F6 and the intermediate birefringent crystal F7 are negative crystals ($n_0 > n_e$), the upper birefringent crystal F2 may be a positive crystal ($n_0 < n_e$). Conversely, when the lower birefringent crystal F6 and the intermediate birefringent crystal F7 are the positive crystals ($n_0 < n_e$), the upper birefringent crystal F2 may be the negative crystal ($n_0 > n_e$). As described above, in the ellipsometer 3 of FIG. 17 and the first to fourth modification examples, the polarizing optical element units 32 to 36 may include a plurality of birefringent crystals having birefringence of $n_0 < n_e$ and $n_0 > n_e$. Other configurations and effects are the same as those described with respect to the ellipsometer 1 of FIG. 4, the apparatus 1A for inspecting the semiconductor device of FIG. 13, and/or the ellipsometer 2 of FIG. 14.

Figure 24:
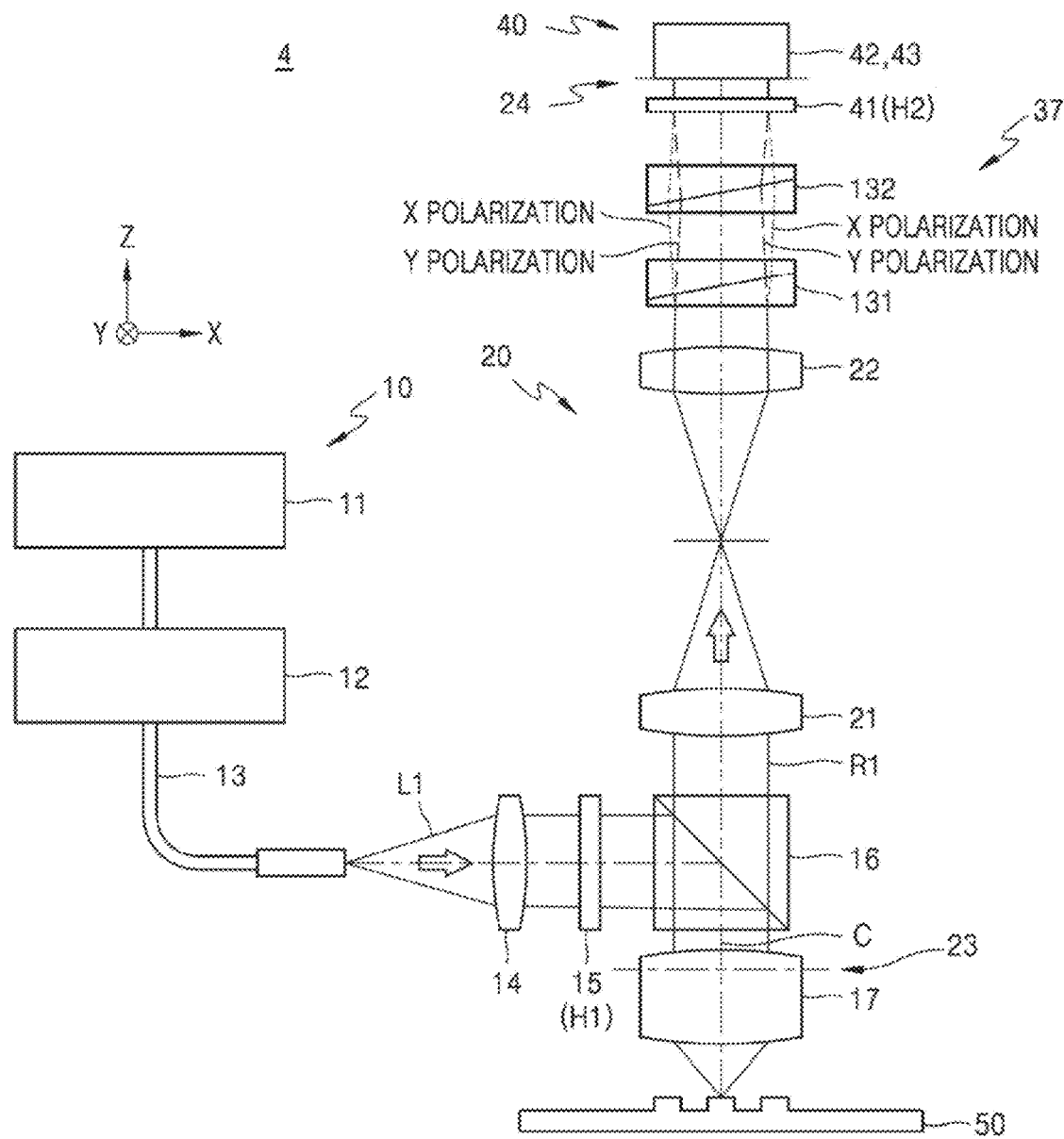
FIG. 24 is a configuration diagram schematically showing an ellipsometer according to an example embodiment of the inventive concepts.

FIG. 24 is a configuration diagram schematically showing an ellipsometer 4 according to an example embodiment of the inventive concepts. The descriptions already given with reference to FIGS. 1 to 23 will be briefly provided or omitted.

Referring to FIG. 24, in the ellipsometer 4 of the present example embodiment, the polarizer unit 15 may include the linear polarizer H1, and the analyzer unit 41 may include the linear polarizer H2. The polarizing optical element unit 37 may include Nomarski prisms 131 and 132. For example, the polarizing optical element unit 37 may include the lower Nomarski prism 131 including a uniaxial birefringent crystal having a positive birefringence of $n_0 < n_e$ and as uniaxial birefringent crystal having as negative birefringence of $n_0 > n_e$, and the upper Nomarski prism 132 including a uniaxial birefringent crystal having positive birefringence and a uniaxial birefringent crystal having negative birefringence. Accordingly, the polarizing optical element unit 37 may separate the reflected light R1 in which the illumination light L1 including linear polarization is reflected from a measurement surface of the sample 50 into two linear polarization components in a linear polarization direction orthogonal to each other. The analyzer unit 41 may form an interference fringe by transmitting through and interfering with two linear polarization components in a direction different from each polarization direction. The image detector 42 may detect the interference fringe. The analysis apparatus 43 may calculate the ellipsometry coefficients Ψ, Δ from the detected interference fringes.

Figure 25:
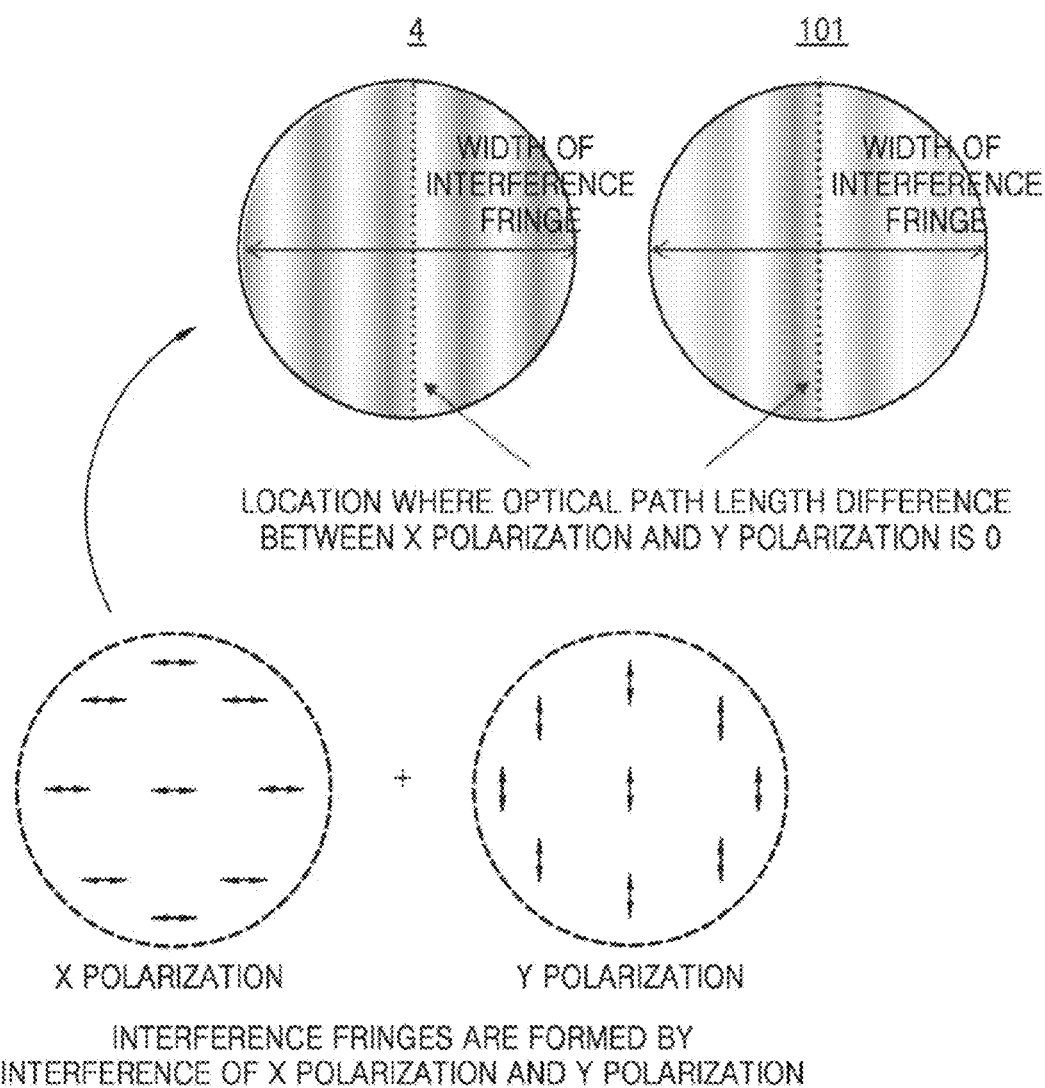
FIG. 25 is a photograph of an interference fringe of reflected light interfering on an image detector in the ellipsometer of FIG. 24, and conceptual diagrams of X polarization and Y polarization.

FIG. 25 is a photograph of an interference fringe of reflected light interfering on the image detector 42 in the ellipsometer 4 of FIG. 24, and conceptual diagrams of X polarization and Y polarization, along with a photograph of an interference fringe of reflected light interfering on an image detector in the ellipsometer 101 of FIG. 1. FIG. 25 will be described with reference to FIG. 24 together.

Referring to FIG. 25, unlike the ellipsometers 1 to 3 of FIGS. 4, 14, and 17, the ellipsometer 4 of the present example embodiment may form the interference fringe of X polarization and Y polarization as vertical stripes in one-dimensional shape on the pupil. However, by using two or more types of crystals having different birefringence, a separation angle of two polarizations may be changed for each wavelength. For example, the Nomarski prisms 131 and 132 may be arranged so that the separation angle of two polarizations immediately before the image detector 42 is relatively large at a long wavelength side and relatively small at a short wavelength side. Accordingly, the ellipsometer 4 of the present example embodiment includes the achromatic Nomarski prism 132, thereby suppressing a decrease in the contrast at both ends in the X-axis direction compared to the ellipsometer 101 of the comparative example. As described above, a Change in the space of the interference fringes due to a difference in the wavelength may be reduced. Therefore, even in measurement using a broadband light source, it may be possible to narrow the space of the interference fringes or to widen the wavelength width compared to the existing methods.

Figure 26:
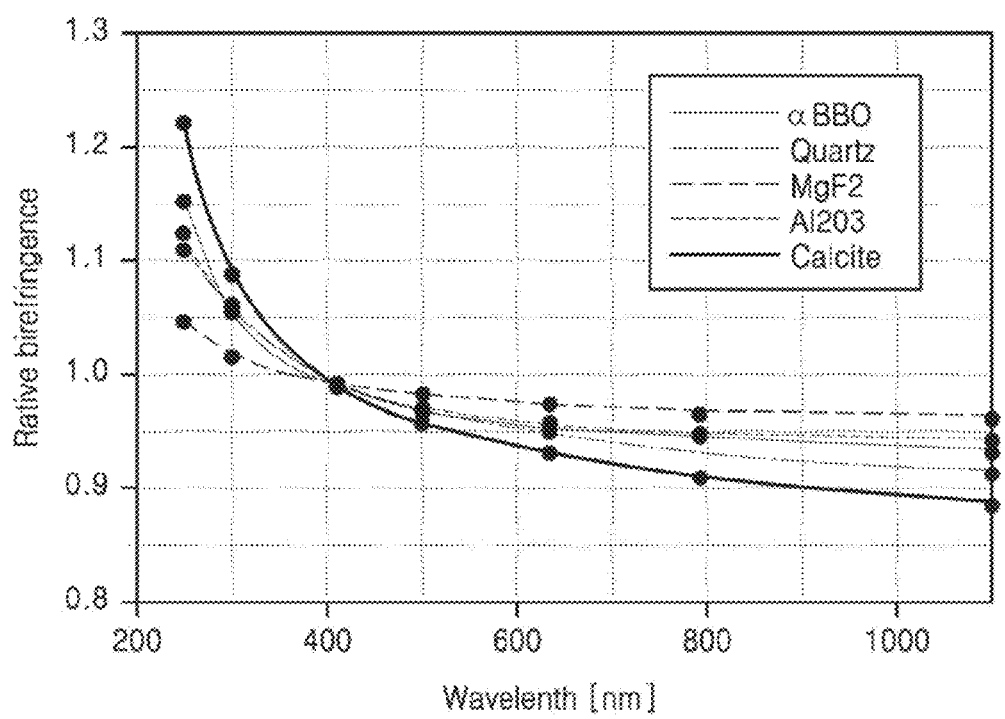
FIG. 26 is a graph showing the wavelength dependence of birefringence in each material of a birefringent crystal.

FIG. 26 is a graph showing the wavelength dependence of birefringence in each material of a birefringent crystal, where the x-axis represents wavelength and the y-axis represents birefringence.

Referring to FIG. 26, the graph shows the wavelength dependence of a polarization separation angle in the case where a value of $(n_0-n_e)/\{(n_0+n_e)/2\}$ is normalized to be 1 when the wavelength is 400 nm, and a Nomarski prism is configured of at least one material of αBBO, quartz, magnesium fluoride ($MgF_2$), sapphire ($Al_2O_3$), or calcite. As shown in the graph, magnesium fluoride may have a relatively small wavelength dependence of the polarization separation angle, and calcite may have a large wavelength dependence of the polarization separation angle. A stripe pitch of an interference fringe may have the same value at a plurality of wavelengths of illumination light.

Figure 27:
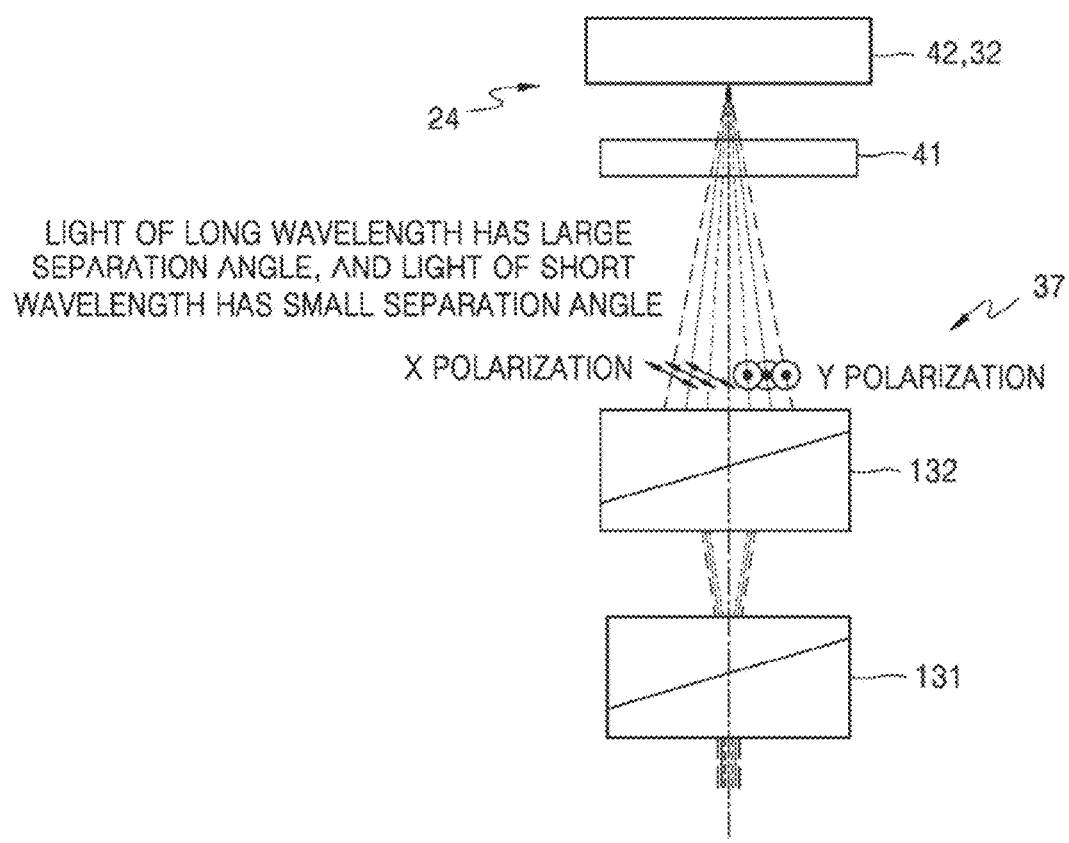
FIG. 27 is a conceptual diagram of a polarizing optical element unit in the ellipsometer of FIG. 24.

FIG. 27 is conceptual diagram of the polarizing optical element unit 37 in the ellipsometer 4 of FIG. 24. FIG. 27 will be described with reference to FIG. 24.

Referring to FIG. 27, when the upper Nomarski prism 132 is configured of calcite and the lower Nomarski prism 131 is configured of magnesium fluoride, a polarization separation angle immediately before the image detector 42 may be relatively large on a long wavelength side and relatively small on a short wavelength side. By designing as described above, the wavelength dependence of a space between the interference fringes may be reduced. Other configurations and effects are the same as those described with respect to the ellipsometer 1 of FIG. 4, the apparatus 1A for inspecting the semiconductor device of FIG. 13, the ellipsometers 2 and 3 of FIGS. 14 and 17, and/or the modification examples of FIGS. 20 to 23.

The technical spirits of the inventive concepts are not limited to the above-described example embodiments, and it is possible to appropriately change the scope without departing from the spirits. For example, the configurations of the example embodiments of FIGS. 4, 13, 14, 17, and 20 to 23 may be combined with each other. Also, an apparatus for inspecting a semiconductor device including the ellipsometers of the example embodiments of FIGS. 14, 17, 20 to 23, and 24 may be included in the technical spirits of the inventive concepts.

In one example embodiment of the inventive concepts, light of linear polarization is transmitted through an objective lens to illuminate a measurement sample simultaneously from a plurality of angles of incidence and azimuth of incidence, reflected light reflected from the measurement sample is incident on the objective lens, is transmitted through a relay lens and a polarizing optical element unit, and then light is received by an image detector disposed at a pupil conjugation location of the objective lens.

In an example embodiment of the inventive Concepts, the polarizing optical element unit includes at least two uniaxial birefringent crystals and a linear polarizer, the two uniaxial birefringent crystals having crystal optical axes perpendicular to each other and perpendicular to the optical axis are combined, and are separated in the radial direction on the optical axis with respect to light that had two polarization components upon reflection from a sample.

In one example embodiment of the inventive concepts, the uniaxial birefringent crystal has a spherical surface in which at least one surface is a convex surface or a concave surface, and does not have refractive power when the two uniaxial birefringent crystals are combined. The two polarization components separated in the uniaxial birefringent crystal interfere with each other on an image detector by a linear polarizer provided immediately before the image detector to form an interference fringe in the form of a concentric circle. Contrast and phase information of an obtained image of the interference fringe are processed to obtain Ψ and Δ of ellipsometry measurement results.

While the inventive concepts have been particularly shown and described with reference to some example embodiments thereof, it will be understood that various changes in form and details may be made therein without departing from the spirit and scope of the following claims.

What is claimed is:

1. An ellipsometer comprising:
a polarizing optical element unit configured to separate reflected light into two polarization components, the two polarization components having polarization directions that are orthogonal to each other in a radial direction with respect to an optical axis of a condensing optical system of the reflected light, the reflected light being light reflected from a measurement surface of a sample when illumination light illuminates the measurement surface of the sample, the illumination light comprising at least one of linear polarization, circular polarization, or elliptical polarization;
with respect to the two polarization components, an analyzer unit configured to transmit components in a direction, which is different from each of the polarization directions of the two polarization components, to make the two polarization components interfere with each other, and to form an interference fringe in a form of a concentric circle;
an image detector configured to detect the interference fringe; and
processing circuitry configured to calculate ellipsometry coefficients Y and A from the detected interference fringe.

2. The ellipsometer of claim 1, further comprising:
a light source configured to generate the illumination light;
a polarizer unit to which the illumination light generated from the light source is incident, the polarizer unit configured to transmit the illumination light therethrough;
an objective lens configured to transmit the illumination light and the reflected light therethrough; and
the condensing optical system configured to image an exit pupil of the objective lens on the image detector.

3. The ellipsometer of claim 2,
wherein the polarizer unit comprises a linear polarizer configured to generate linear polarization, and
wherein the analyzer unit comprises a linear polarizer configured to make a linear polarization component in a certain direction be transmitted therethrough.

4. The ellipsometer of claim 3,
wherein the polarizing optical element unit comprises a Wollaston lens,
wherein the Wollaston lens comprises two uniaxial birefringent crystals having a spherical shape to fit each other, and
wherein crystal optical axes of the two uniaxial birefringent crystals are orthogonal to the optical axis of the condensing optical system and orthogonal to each other.

5. The ellipsometer of claim 4,
wherein the polarizing optical element unit further comprises another Wollaston lens, and
wherein the two polarization components of the reflected light transmitted through the polarizing optical element unit and the analyzer unit are detected at a same point on the image detector.

6. The ellipsometer of claim 2,
wherein the polarizer unit comprises a circular polarizer configured to generate circular polarization that rotates in any one of a left rotation or a right rotation with respect to an optical axis of the illumination light, and
wherein the analyzer unit comprises a circular polarizer configured to transmit therethrough a circular polarization component rotating in any one of the left rotation or the right rotation.

7. The ellipsometer of claim 6, wherein the circular polarizer of each of the polarizer unit and the analyzer unit comprises a linear polarizer and a λ/4 wave plate.

8. The ellipsometer of claim 6,
wherein the polarizing optical element unit comprises a first birefringent crystal having a parallel plane plate shape and being at a location where the reflected light is condensed or diffused in the condensing optical system, wherein the first birefringent crystal is a uniaxial birefringent crystal, and wherein a crystal optical axis of the first birefringent crystal is parallel to the optical axis of the condensing optical system.

9. The ellipsometer of claim 6, wherein the polarizing optical element unit comprises a first birefringent crystal having a parallel plane plate shape and being at a location where the reflected light is condensed or diffused in the condensing optical system; and a second birefringent crystal having an incident surface having a concave cone shape and an exit surface having a convex cone shape, wherein the first birefringent crystal and the second birefringent crystal are uniaxial birefringent crystals, and wherein a crystal optical axis of the first birefringent crystal and a crystal optical axis of the second birefringent crystal are parallel to the optical axis of the condensing optical system.

10. The ellipsometer of claim 6, wherein the polarizing optical element unit comprises a first birefringent crystal having a parallel plane plate shape and being at a location where the reflected light is condensed or diffused in the condensing optical system; and a second birefringent crystal having a parallel plane plate shape and being at the location where the reflected light is condensed or diffused in the condensing optical system, wherein the first birefringent crystal and the second birefringent crystal are uniaxial birefringent crystals, and wherein a crystal optical axis of the first birefringent crystal and a crystal optical axis of the second birefringent crystal are parallel to the optical axis of the condensing optical system.

11. The ellipsometer of claim 6, wherein the polarizing optical element unit comprises a first birefringent crystal at a location where the reflected light is condensed or diffused in the condensing optical system, and having an incident surface having a concave spherical shape and an exit surface having a convex spherical shape; and a second birefringent crystal having an incident surface having a concave cone shape and an exit surface having a convex cone shape, wherein the first birefringent crystal and the second birefringent crystal are uniaxial birefringent crystals, and wherein a crystal optical axis of the second birefringent crystal and a crystal optical axis of the first birefringent crystal are parallel to the optical axis of the condensing optical system.

12. The ellipsometer of claim 6, wherein the polarizing optical element unit comprises a first birefringent crystal having a parallel plane plate shape and being at a location where the reflected light is condensed or diffused in the condensing optical system;

a second birefringent crystal having a parallel plane plate shape;

a first glass substrate on an incident surface side of the second birefringent crystal, the first glass substrate having an incident surface having a concave cone shape, and an exit surface having a planar shape; and a second glass substrate on an exit surface side of the second birefringent crystal, the second glass substrate having an incident surface having a planar shape, and an exit surface having a convex conical shape, wherein the first birefringent crystal and the second birefringent crystal are uniaxial birefringent crystals, and wherein a crystal optical axis of the first birefringent crystal and a crystal optical axis of the second birefringent crystal are parallel to an optical axis of the condensing optical system.

13. The ellipsometer of claim 6, wherein the polarizing optical element unit comprises a first birefringent crystal having a parallel plane plate shape and being at a location where the reflected light is condensed or diffused in the condensing optical system;

a second birefringent crystal having a parallel plane plate shape and being at a location where the reflected light is condensed or diffused in the condensing optical system; and a third birefringent crystal having an incident surface having a concave cone shape and an exit surface having a convex cone shape, wherein the first birefringent crystal, the second birefringent crystal, and the third birefringent crystal are uniaxial birefringent crystals, wherein a crystal optical axis of the third birefringent crystal is parallel to the optical axis of the condensing optical system, and wherein a crystal optical axis of the first birefringent crystal and a crystal optical axis of the second birefringent crystal are orthogonal to the optical axis of the condensing optical system and orthogonal to each other.

14. The ellipsometer of claim 6, wherein the polarizing optical element unit comprises at least two birefringent crystals having opposite birefringence, the at least two birefringent crystals including a first birefringent crystal and a second birefringent crystal, the first birefringent crystals having a refractive index of ordinary light less than a refractive index of extraordinary light, the second birefringent crystal having the refractive index of the ordinary light greater than the refractive index of the extraordinary light.

15. The ellipsometer of claim 2, wherein the polarizing optical element unit comprises a birefringent crystal including any one of quartz, magnesium fluoride, sapphire, calcite, or Alpha-Barium Borate (αBBO).

16. The ellipsometer of claim 1, wherein with respect to an image comprising the interference fringe in the form of the concentric circle, the processing circuitry is further configured to, convert coordinates to polar coordinates so that a center of the concentric circle is a coordinate origin, perform a two-dimensional (2D) Fourier transform, on a 2D coordinate plane with a radius and a polar angle of the polar coordinates as axes, divide a frequency space image after the 2D Fourier transform into a DC component and an AC component and trim the DC component and the AC component, and calculate the ellipsometry coefficients Y' and A based on a result of an inverse Fourier transform of the trimmed DC component and the trimmed AC component.

17. An ellipsometer comprising:
a polarizing optical element unit configured to separate reflected light into two linear polarization components, the two linear polarization components having polarization directions that are orthogonal to each other, the reflected light being light reflected from a measurement surface of a sample when illumination light comprising linear polarization illuminates the measurement surface of the sample;
with respect to the two linear polarization components, an analyzer unit configured to transmit components in a direction, which is different from each of the polarization directions of the two linear polarization components, to make the two linear polarization components interfere with each other, and form an interference fringe in a form of a stripe;
an image detector configured to detect the interference fringe; and
processing circuitry configured to calculate ellipsometry coefficients Y and A from the detected interference fringe,
wherein the polarizing optical element unit comprises a plurality of Nomarski prisms.

18. The ellipsometer of claim 17, wherein the plurality of Nomarski prisms comprises
a first Nomarski prism comprising a uniaxial birefringent crystal having a positive birefringence where a refractive index of ordinary light is less than a refractive index of extraordinary light and a uniaxial birefringent crystal having a negative birefringence where the refractive index of ordinary light is greater than the refractive index of extraordinary light, and
a second Nomarski prism comprising a uniaxial birefringent crystal having the positive birefringence and a uniaxial birefringent crystal having the negative birefringence.

19. The ellipsometer of claim 18,
wherein the first Nomarski prism and the second Nomarski prism are arranged so that a separation angle of two polarizations immediately before the image detector is large on a long wavelength side and small on a short wavelength side.

20. An apparatus for inspecting a semiconductor device, the apparatus comprising:
an ellipsometer;
a stage configured to receive thereon the semiconductor device as an inspection target; and
an environment chamber configured to isolate a part of the ellipsometer and the stage from an external environment,
wherein the ellipsometer comprises,
a polarizing optical element unit configured to separate reflected light into two polarization components, the two polarization components having polarization direction that are orthogonal to each other in a radial direction with respect to an optical axis of an optical system of the reflected light, the reflected light being light reflected from a measurement surface of a sample when illumination light illuminates the measurement surface of the sample, the illumination light comprising at least one of linear polarization, circular polarization, or elliptical polarization;
with respect to the two polarization components, an analyzer unit configured to transmit components of in a direction, which is different from the polarization direction of each of two polarization components, to make the two polarization components interfere with each other and to form an interference fringe in a form of a concentric circle;
an image detector configured to detect the interference fringe; and
processing circuitry configured to calculate ellipsometry coefficients $\Psi$ and $\Delta$ from the detected interference fringe.

* * * * *